US012641859B2

(12) United States Patent
Inokuchi et al.

(10) Patent No.: US 12,641,859 B2
(45) Date of Patent: May 26, 2026

(54) SEMICONDUCTOR DEVICE WITH CONDUCTIVE MEMBERS HAVING SCHOTTKY CONTACT

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tomoaki Inokuchi, Kanagawa (JP); Hiro Gangi, Tokyo (JP); Yusuke Kobayashi, Yokohama (JP); Tatsuya Nishiwaki, Yokohama (JP); Shotaro Baba, Kawasaki (JP); Hiroki Nemoto, Nonoichi (JP); Tatsunori Sakano, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 754 days.

(21) Appl. No.: 18/171,820

(22) Filed: Feb. 21, 2023

(65) Prior Publication Data

US 2024/0030344 A1     Jan. 25, 2024

(30) Foreign Application Priority Data

Jul. 25, 2022     (JP) ................................. 2022-117702

(51) Int. Cl.
*H10D 64/64*      (2025.01)
*H10D 64/27*      (2025.01)

(52) U.S. Cl.
CPC ......... *H10D 64/647* (2025.01); *H10D 64/518* (2025.01); *H10D 64/64* (2025.01)

(58) Field of Classification Search
CPC ..... H10D 64/647; H10D 64/518; H10D 64/64
See application file for complete search history.

(56) References Cited

U.S. PATENT DOCUMENTS

| | | | |
|---|---|---|---|
| 9,525,059 B1 | 12/2016 | Kobayashi | |
| 2013/0313638 A1* | 11/2013 | Yoshimochi | ......... H10D 30/668 257/334 |
| 2022/0293754 A1 | 9/2022 | Inokuchi et al. | |

FOREIGN PATENT DOCUMENTS

| | | |
|---|---|---|
| JP | 2015-008184 A | 1/2015 |
| JP | 2017-055016 A | 3/2017 |

(Continued)

OTHER PUBLICATIONS

H. Yamaguchi et al., "Breakthrough of on-resistance Si limit by Super 3D MOSFET under 100V breakdown voltage", Proceedings of the 18th International Symposium on Power Semiconductor Devices & IC's, (2006).

*Primary Examiner* — Norman D Richards
*Assistant Examiner* — Sean Ayers Winters
(74) *Attorney, Agent, or Firm* — Maier & Maier, PLLC

(57) ABSTRACT

According to one embodiment, a semiconductor device includes a first element. The first element includes a first conductive member, a second conductive member, a first semiconductor member, a third conductive member, and a third conductive member wiring. The first conductive member includes a first conductive portion including a first face and a second conductive portion including a second face. The second conductive member includes a third conductive portion including a third face and a fourth conductive portion including a fourth face. The fourth conductive portion includes a facing conductive portion. The first semiconductor member is of a first conductive type. The first semiconductor member includes a first partial region, a second partial region and a third partial region. The third (Continued)

partial region includes a facing face facing the facing conductive portion. The third conductive member wiring is electrically connected to the third conductive member.

19 Claims, 18 Drawing Sheets

(56)                    References Cited

FOREIGN PATENT DOCUMENTS

| | | | |
|---|---|---|---|
| JP | 6400545 | B2 | 10/2018 |
| JP | 2022-138435 | A | 9/2022 |

* cited by examiner

SEMICONDUCTOR DEVICE WITH CONDUCTIVE MEMBERS HAVING SCHOTTKY CONTACT

CROSS-REFERENCE TO RELATED APPLICATIONS

This application is based upon and claims the benefit of priority from Japanese Patent Application No. 2022-117702, filed on Jul. 25, 2022; the entire contents of which are incorporated herein by reference.

FIELD

Embodiments described herein generally relate to a semiconductor device.

BACKGROUND

For example, improvement in characteristics is desired in semiconductor devices.

DETAILED DESCRIPTION

Figure 1:
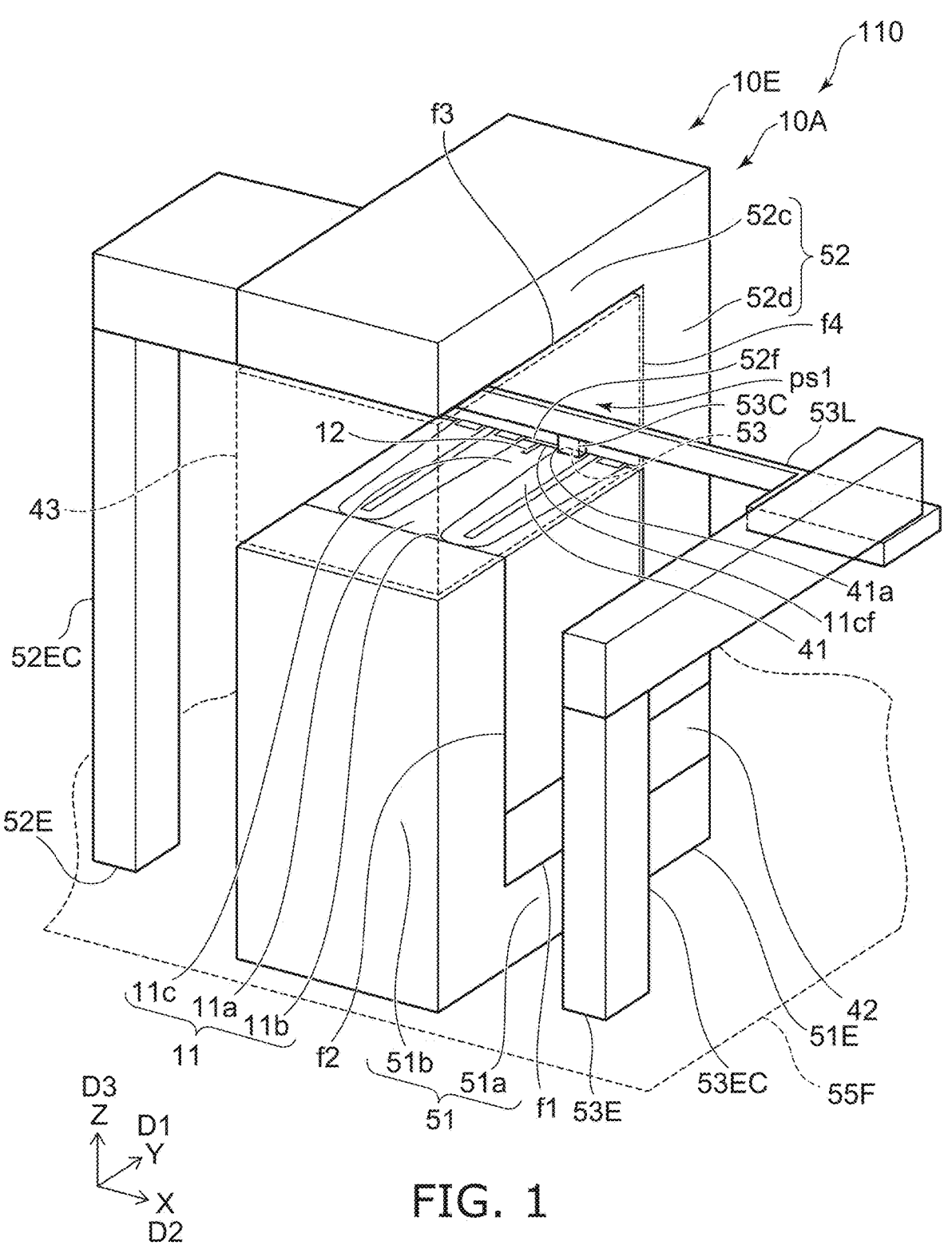
FIG. 1 is a schematic perspective view illustrating a semiconductor device according to a first embodiment.

According to one embodiment, a semiconductor device includes a first element. The first element includes a first conductive member, a second conductive member, a first semiconductor member, a third conductive member, and a third conductive member wiring. The first conductive member includes a first conductive portion including a first face and a second conductive portion including a second face. The first face is along a first direction and a second direction. The second direction crosses the first direction. The second face is along the second direction and a third direction. The third direction crosses a plane including the first direction and the second direction. The second conductive member includes a third conductive portion including a third face and a fourth conductive portion including a fourth face. The third face is along the first direction and the second direction. The fourth face is along the second direction and the third direction. A direction from the first conductive portion to the third conductive portion is along the third direction. A direction from the second conductive portion to the fourth conductive portion is along the first direction. The fourth conductive portion includes a facing conductive portion. The first semiconductor member is of a first conductive type. The first semiconductor member is located between the first conductive portion and the third conductive portion in the third direction. The first semiconductor member is located between the second conductive portion and the fourth conductive portion in the first direction. The first semiconductor member includes a first partial region, a second partial region and a third partial region. A direction from the first partial region to the second partial region is along the second direction. The third partial region is located between the first partial region and the facing conductive portion in the first direction. The third partial region includes a facing face facing the facing conductive portion. A direction from the facing face to the third conductive member is along the second direction. The third conductive member wiring is electrically connected to the third conductive member. At least a part of the third conductive member wiring passes through one of a first position between the first semiconductor member and the third conductive portion or a second position between the first semiconductor member and the first conductive portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic perspective view illustrating a semiconductor device according to the first embodiment.

Figure 2:
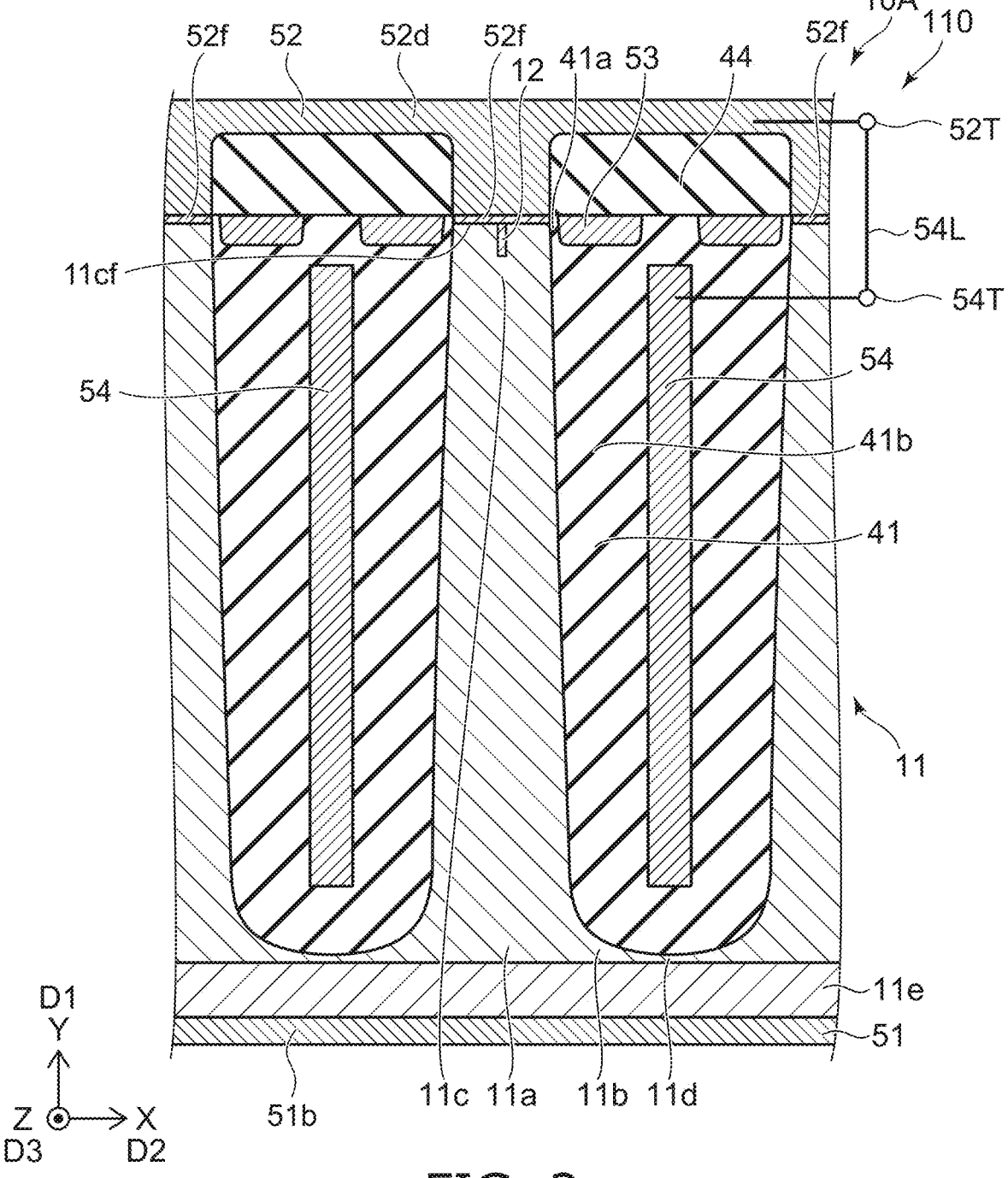
FIG. 2 is a schematic cross-sectional view illustrating the semiconductor device according to the first embodiment.

FIG. 2 is a schematic cross-sectional view illustrating the semiconductor device according to the first embodiment.

As shown in FIG. 1, a semiconductor device 110 according to the embodiment includes a first element 10A. As will be described later, the semiconductor device according to the embodiment may include multiple elements 10E. The first element 10A corresponds to one of the plurality of elements 10E.

The first element 10A includes a first conductive member 51, a second conductive member 52, a third conductive member 53, a first semiconductor member 11, and a third conductive member wiring 53L.

The first conductive member 51 includes a first conductive portion 51a and a second conductive portion 51b. The first conductive portion 51a includes a first face f1. The second conductive portion 51b includes a second face f2. The first face f1 extends along a first direction D1 and a second direction D2. The second direction D2 crosses the first direction D1. The second face f2 extends along the second direction D2 and a third direction D3. The third direction D3 crosses a plane (D1-D2 plane) including the first direction D1 and the second direction D2.

The first direction D1 is, for example, a Y-axis direction. One direction perpendicular to the Y-axis direction is defined as an X-axis direction. The direction perpendicular to the Y-axis direction and the X-axis direction is defined as a Z-axis direction. The second direction D2 is, for example, the X-axis direction. The third direction D3 is, for example, the Z-axis direction.

The second conductive member 52 includes a third conductive portion 52c and a fourth conductive portion 52d. The third conductive portion 52c includes a third face f3. The fourth conductive portion 52d includes a fourth face f4. The third face f3 extends along the first direction D1 and the second direction D2. The fourth face f4 extends along the second direction D2 and the third direction D3. The direction from the first conductive portion 51a to the third conductive portion 52c is along the third direction D3. The direction from the second conductive portion 51b to the fourth conductive portion 52d is along the first direction D1. The fourth conductive portion 52d includes a facing conductive portion 52f.

The first semiconductor member 11 is of a first conductivity type. The first conductivity type is one of n-type and p-type. The first conductivity type is, for example, n-type.

The first semiconductor member 11 is located between the first conductive portion 51a and the third conductive portion 52c in the third direction D3. The first semiconductor member 11 is located between the second conductive portion 51b and the fourth conductive portion 52d in the first direction D1.

The first semiconductor member 11 includes a first partial region 11a, a second partial region 11b and a third partial region 11c. A direction from the first partial region 11a to the second partial region 11b is along the second direction D2. The third partial region 11c is located between the first partial region 11a and the facing conductive portion 52f in the first direction D1. The third partial region 11c includes a facing face 11cf. The facing face 11cf faces the facing conductive portion 52f.

For example, the facing face 11cf extends along the third direction D3. The facing face 11cf contacts, for example, the facing conductive portion 52f. A direction from the facing face 11cf to the third conductive member 53 is along the second direction D2 (see FIG. 2).

The third conductive member wiring 53L is electrically connected to the third conductive member 53. At least a part of the third conductive member wiring 53L passes through a first position ps1 between the first semiconductor member 11 and the third conductive portion 52c. As will be described later, at least a part of the third conductive member wiring 53L may pass through a second position between the first semiconductor member 11 and the first conductive portion 51a. In the example of FIG. 1, the third conductive member wiring 53L passes through the first position ps1.

The third conductive member 53 extends along the third direction D3. In this example, an intermediate connect portion 53C is provided. The intermediate connect portion 53C extends along the third direction D3. The third conductive member wiring 53L is electrically connected to the third conductive member 53 by the intermediate connect portion 53C.

In this example, a first insulating member 41 is provided. The first insulating member 41 includes a first insulating region 41a. At least a part of the first insulating region 41a is located between the facing face 11cf and the third conductive member 53 in the second direction D2 (see FIG. 2).

A current flowing between the first conductive member 51 and the second conductive member 52 can be controlled by a potential of the third conductive member 53. The potential of the third conductive member 53 may be a potential based on a potential of the second conductive member 52. The first conductive member 51 functions, for example, as a drain electrode. The second conductive member 52 functions, for example, as a source electrode. The third conductive member 53 functions, for example, as a gate electrode. The first insulating region 41a functions, for example, as a gate insulating film. The semiconductor device 110 is, for example, a transistor.

As shown in FIG. 1, the first element 10A includes a third conductive connect portion 53EC. The third conductive connect portion 53EC is electrically connected to the third conductive member wiring 53L. At least a part of the third conductive connect portion 53EC extends along the third direction D3. A direction from the first semiconductor member 11 to the third conductive connect portion 53EC crosses the third direction D3.

As shown in FIG. 1, the first element 10A includes a first element face 55F. The first element face 55F is along the above-described plane (D1-D2 plane). In one example, the first element face 55F is a mounting face of semiconductor device 110. For example, the first element face 55F faces a mounting member.

As shown in FIG. 1, the third conductive connect portion 53EC reaches the first element face 55F. The third conductive connect portion 53EC is exposed at the first element face 55F. An end portion of the third conductive connect portion 53EC becomes a third electrode terminal 53E. The third electrode terminal 53E becomes, for example, a gate electrode terminal.

As shown in FIG. 1, the first element 10A further includes a second conductive connect portion 52EC. The second conductive connect portion 52EC is electrically connected to the third conductive portion 52c. At least a part of the second conductive connect portion 52EC extends along the third direction D3. The second conductive connect portion 52EC is exposed at the first element face 55F. An end portion of the second conductive connect portion 52EC becomes a second electrode terminal 52E. The second electrode terminal 52E becomes, for example, a source electrode terminal.

For example, the first conductive portion 51a is exposed at the first element face 55F. The first conductive portion 51a becomes the first electrode terminal 51E. The first electrode terminal 51E may function as a drain electrode terminal.

A part of the first conductive member 51 is exposed to the outside of the semiconductor package at the first element face 55F. Conductive portions electrically connected to the second conductive member 52 and the third conductive member 53 are exposed to the outside of the semiconductor package at the first element face 55F. The conductive members exposed to the outside of the semiconductor package function as a terminal of the first element 10A.

As shown in FIG. 1, the first element 10A may further include a second insulating member 42 and a third insulating member 43. The second insulating member 42 is provided between the first conductive portion 51a and the first semiconductor member 11. The second insulating member 42 electrically insulates between the first conductive portion 51a and the first semiconductor member 11. The third insulating member 43 is provided between the first semiconductor member 11 and the third conductive portion 52c. The third insulating member 43 electrically insulates between the first semiconductor member 11 and the third conductive portion 52c. In this example, the third conductive member wiring 53L passes through the third insulating member 43. The third insulating member 43 is provided around the first position ps1 through which at least a part of the third conductive member wiring 53L passes.

In the semiconductor device 110 illustrated in FIG. 1, the first element 10A is, for example, a drain-down semiconductor device (semiconductor package).

For example, the third partial region 11c and the facing conductive portion 52f may have a Schottky contact. The semiconductor device 110 is a Schottky contact transistor.

For example, a Schottky barrier is formed at the interface between the third partial region 11c and the facing conductive portion 52f. The thickness of the Schottky barrier can be controlled by the potential of the third conductive member 53. Substantially no current flows when the Schottky barrier is thick. As a result, an off-state is obtained. By controlling the potential of the third conductive member 53, the Schottky barrier becomes thin and, for example, a tunnel current flows. By the fowling the tunnel current, an on-state is obtained. For example, a low on-resistance is easily obtained. According to the embodiment, a semiconductor device with improved characteristics can be provided.

In the embodiments, the body diode is a Schottky diode. Recovery can be performed in a high speed. For example, the gate length can be shortened. As a result, the gate capacitance becomes small. This results in fast switching. The loss is small. For example, gate driver losses can be reduced. For example, switching can be speeded up. For example, turn-on loss and turn-off loss can be suppressed. In the embodiments, the transistors may be provided in a high density. The channel area per unit area can be increased. Thereby, for example, on-resistance can be reduced. Large current can be switched.

In the embodiment, the first semiconductor member 11 may include, for example, at least one selected from the group consisting of silicon (Si), nitride semiconductors (e.g., GaN), silicon carbide (SiC), and oxide semiconductors (e.g., GaO). In the case where the first semiconductor member 11 include silicon, the impurity of the first conductive type includes, for example, at least one selected from the group consisting of phosphorus, arsenic, and antimony.

In one example, in the case where the third partial region 11c of the first semiconductor member 11 includes silicon, the facing conductive portion 52f of the second conductive member 52 includes at least one selected from the group consisting of, for example, Ti, W, Mo, Ta, Zr, Al, Sn, V, Re, Os, Ir, Pt, Pd, Rh, Ru, Nb, Sr, and Hf.

The third conductive member 53 may include, for example, at least one of polysilicon or metal. The first conductive member 51 includes, for example, Al, Cu, Mo, W, Ta, Co, Ru, Ti and Pt. The second conductive member 52 includes, for example, at least one selected from the group consisting of Al, Cu, Mo, W, Ta, Co, Ru, Ti, and Pt.

As shown in FIG. 1 and FIG. 2, the semiconductor device 110 may further include a second semiconductor region 12. The second semiconductor region 12 is of a second conductive type. The second conductive type is the other of the n-type and the p-type. The second conductive type is, for example, the p-type. The second semiconductor region 12 is located between a part portion of the third partial region 11c and a part of the facing conductive portion 52f in the first direction D1 (Y-axis direction). Another part of the third partial region 11c is located between the second semiconductor region 12 and the first insulating region 41a in the second direction D2 (e.g., the X-axis direction).

By providing the second semiconductor region 12, for example, the leakage current can be reduced. In the case where the second semiconductor region 12 includes silicon, the impurity of the second conductive type includes, for example, at least one selected from the group consisting of boron, gallium and indium. As described later, the second semiconductor region 12 may be omitted.

As shown in FIG. 2, the first element 10A may further include a fourth insulating member 44. The fourth insulating member 44 is, for example, located between the third conductive member 53 and the fourth conductive portion 52d. The fourth insulating member 44 electrically insulates between the third conductive member 53 and the fourth conductive portion 52d.

As shown in FIG. 2, the first element 10A may further include a fourth conductive member 54. The first semiconductor member 11 may further include a fourth partial region 11d. In the second direction D2, the second partial region 11b is located between the first partial region 11a and the fourth partial region 11d. A direction from the fourth partial region 11d to the fourth conductive member 54 is along the first direction D1. The direction from at least a part of the third partial region 11c to the fourth conductive member 54 is along the second direction D2.

The first insulating member 41 includes a second insulating region 41b. The second insulating region 41b is located between at least a part of the third partial region 11c and the fourth conductive member 54 in the second direction D2. A position of at least a part of the fourth conductive member 54 in the first direction D1 is between a position of the fourth partial region 11d in the first direction D1 and a position of the third conductive member 53 in the first direction D1.

The fourth conductive member 54 is electrically connected with the second conductive member 52. Alternatively, the fourth conductive member 54 can be electrically connected with the second conductive member 52. For example, the fourth conductive member 54 is electrically connected to the second conductive member 52 by a wiring 54L. For example, a terminal 54T electrically connected to the fourth conductive member 54 may be provided. For example, a terminal 52T electrically connected to the second conductive member 52 may be provided. These terminals may be electrically connected by a wiring (for example, wiring 54L).

The fourth conductive member 54 functions, for example, as a field plate. For example, local concentration of the electric field is suppressed. A more stable operation can be obtained.

As shown in FIG. 2, the first semiconductor member 11 may include a fifth partial region 11*e*. The fifth partial region 11*e* is provided between the second conductive portion 51*b* and the first partial region 11*a*, between the second conductive portion 51*b* and the second partial region 11*b*, and between the second conductive portion 51*b* and the fourth partial region 11*d*. The impurity concentration of the first conductive type in the fifth partial region 11*e* is higher than the impurity concentration of the first conductive type in the first partial region 11*a*. A low electrical resistance is obtained between the first semiconductor member 11 and the second conductive portion 51*b*.

As shown in FIG. 2, the first element 10A may include a plurality of facing conductive portions 52*f* and a plurality of fourth conductive members 54. A position of one of the plurality of facing conductive portions 52*f* in the second direction D2 is between a position of one of the plurality of fourth conductive members 54 in the second direction D2 and a position of another one of the plurality of fourth conductive members 54 in the second direction D2. The other one of the plurality of fourth conductive members 54 is next to the one of the plurality of fourth conductive members 54.

For example, a position of one of the plurality of fourth conductive members 54 in the second direction D2 is between a position of one of the plurality of facing conductive portions 52*f* in the second direction D2 and a position of another one of the plurality of facing conductive portions 52*f* in the second direction D2. The other one of the plurality of facing conductive portions 52*f* is next to the one of the plurality of facing conductive portions 52*f*.

Figure 3:
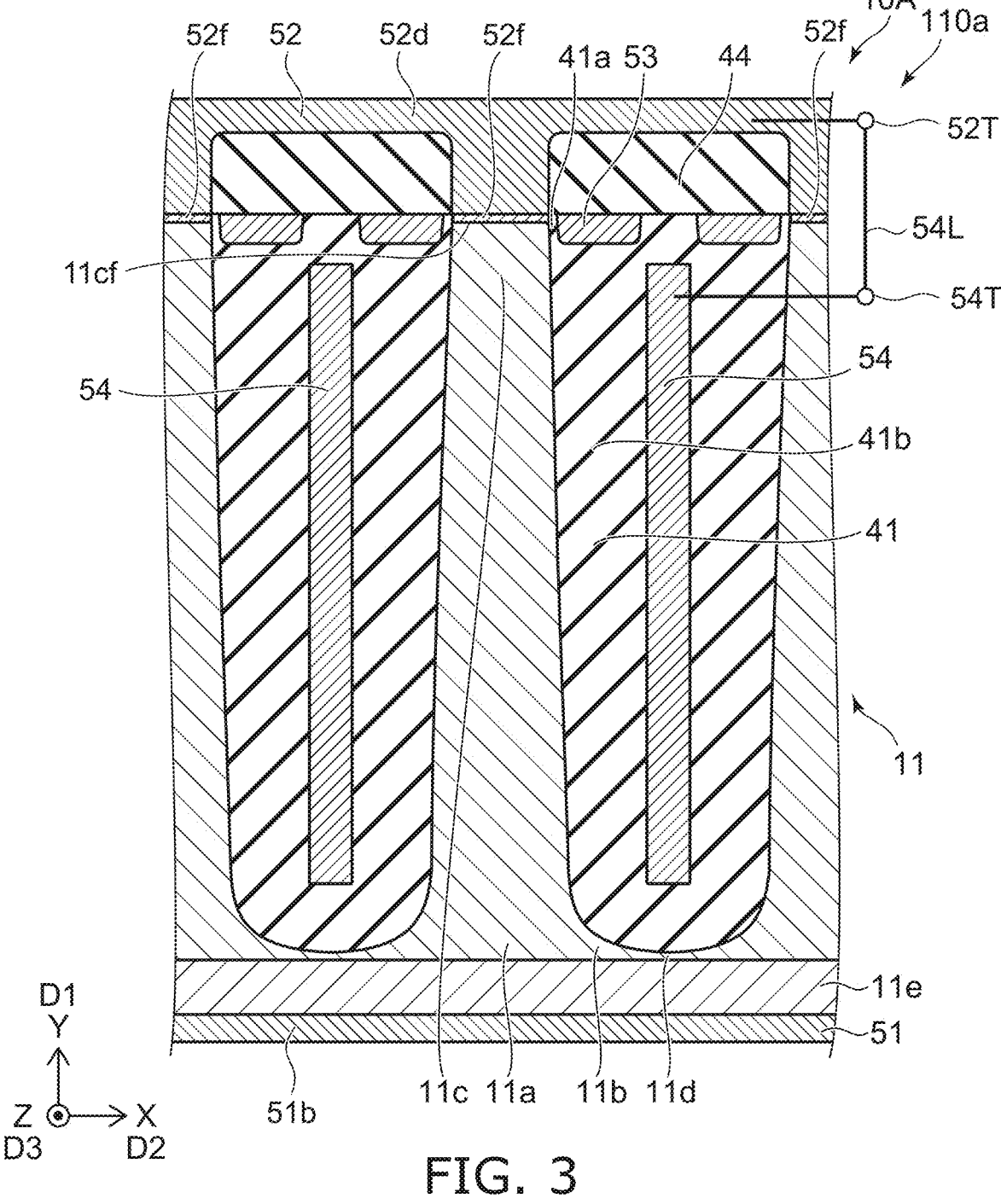
FIG. 3 is a schematic cross-sectional view illustrating a semiconductor device according to the first embodiment.

FIG. 3 is a schematic cross-sectional view illustrating a semiconductor device according to the first embodiment.

As shown in FIG. 3, in a semiconductor device 110*a* according to the embodiment, the second semiconductor region 12 is omitted. Except for this, the configuration of the semiconductor device 110*a* may be the same as the configuration of the semiconductor device 110. In the semiconductor device 110*a*, for example, it is easy to obtain a low on-resistance. A semiconductor device capable of improving characteristics can be provided. For example, switching can be accelerated. For example, turn-on loss and turn-off loss can be suppressed. The channel area per unit area can be increased. Large current can be switched.

Figure 4:
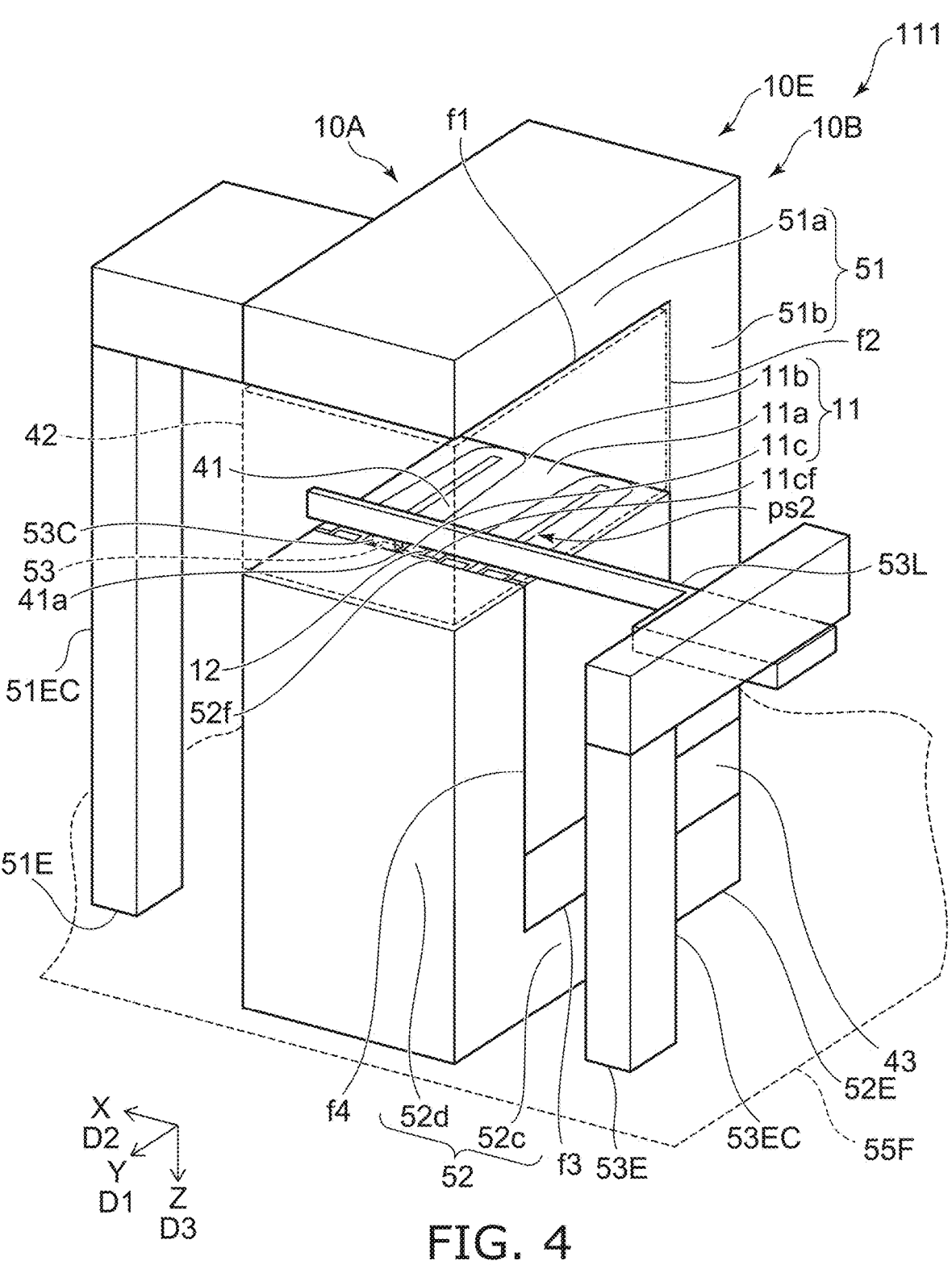
FIG. 4 is a schematic perspective view illustrating a semiconductor device according to the first embodiment.

FIG. 4 is a schematic perspective view illustrating a semiconductor device according to the first embodiment.

As shown in FIG. 4, a semiconductor device 111 according to the embodiment includes at least one element 10E. In the case where multiple elements 10E are provided, the element 10E illustrated in FIG. 4 may be regarded as the second element 10B. In the semiconductor device according to the embodiment, in the case where one element 10E is provided, the element 10E illustrated in FIG. 4 may be regarded as the first element 10A. Hereinafter, the case where the element 10E illustrated in FIG. 4 is the first element 10A will be described.

As shown in FIG. 4, in the semiconductor device 111, the first element 10A includes the first conductive member 51, the second conductive member 52, the third conductive member 53, the first semiconductor member 11, and the third conductive member wiring 53L. In this example, at least a part of the third conductive member wiring 53L passes through the second position ps2 between the first semiconductor member 11 and the first conductive portion 51*a*. Except for this, the configuration of the semiconductor device 111 may be the same as the configuration of the semiconductor device 110.

In the semiconductor device 111 illustrated in FIG. 4, the first element 10A (or the second element 10B) is, for example, a source-down semiconductor device (semiconductor package).

Also in this example, the third conductive member 53 extends along the third direction D3. The third conductive member wiring 53L is electrically connected to the third conductive member 53 by the intermediate connect portion 53C. The first element 10A includes the third conductive connect portion 53EC. The third conductive connect portion 53EC is electrically connected to the third conductive member wiring 53L. At least part of the third conductive connect portion 53EC extends along the third direction D3. A direction from the first semiconductor member 11 to the third conductive connect portion 53EC crosses the third direction D3. The third conductive connect portion 53EC reaches the first element face 55F. The third conductive connect portion 53EC is exposed at the first element face 55F. An end portion of the third conductive connect portion 53EC becomes a third electrode terminal 53E. The third electrode terminal 53E is, for example, a gate electrode terminal.

As shown in FIG. 4, in the semiconductor device 111, the first element 10A further includes a first conductive connect portion 51EC. The first conductive connect portion 51EC is electrically connected to the first conductive portion 51*a*. At least a part of the first conductive connect portion 51EC extends along the third direction D3. The first conductive connect portion 51EC is exposed at the first element face 55F. An end portion of the first conductive connect portion 51EC becomes a first electrode terminal 51E. The first electrode terminal 51E becomes, for example, a drain electrode terminal.

For example, the third conductive portion 52*c* is exposed at the first element face 55F. The third conductive portion 52*c* becomes the second electrode terminal 52E. The second electrode terminal 52E may function, for example, as a source electrode terminal.

As shown in FIG. 4, the first element 10A (or the second element 10B) includes the second insulating member 42 and the third insulating member 43. The second insulating member 42 is located between the first conductive portion 51*a* and the first semiconductor member 11. The third insulating member 43 is located between the first semiconductor member 11 and the third conductive portion 52*c*. The third conductive member wiring 53L passes through the inside of the second insulating member 42, for example. The second insulating member 42 is provided around the second position ps2 through which the third conductive member wiring 53L passes.

In the semiconductor device 111, a low on-resistance is also obtained. According to the embodiment, a semiconductor device with improved characteristics can be provided. For example, high speed recovery can be performed. For example, the gate length can be shortened. Fast switching is obtained. Loss can be reduced. For example, the gate driver losses can be reduced. High speed switching can be performed. For example, turn-on loss and turn-off loss can be suppressed. A high density of transistors can be provided. The channel area per unit area can be increased. For example, on-resistance can be reduced. A switching with large currents can be performed. In the configuration of the semiconductor device 111, the second semiconductor region 12 may be omitted.

In the configuration of the semiconductor device 110 illustrated in FIG. 1, the conductive member serving as the first conductive portion 51*a* is electrically connected to the second conductive portion 51b. On the other hand, the conductive member serving as the third conductive portion 52c is electrically connected to the fourth conductive portion 52d.

For example, in manufacturing the semiconductor device 110, by changing the pattern of the mask used for processing, the conductive member serving as the first conductive portion 51a can be electrically connected to the fourth conductive portion 52d, and the conductive member serving as the third conductive portion 52c can be electrically connected to the second conductive portion 51b. By changing the pattern of the mask, the semiconductor device 110 and the semiconductor device 111 can be easily manufactured. For example, a drain-down semiconductor package or a source down semiconductor package can be easily obtained.

Figure 5:
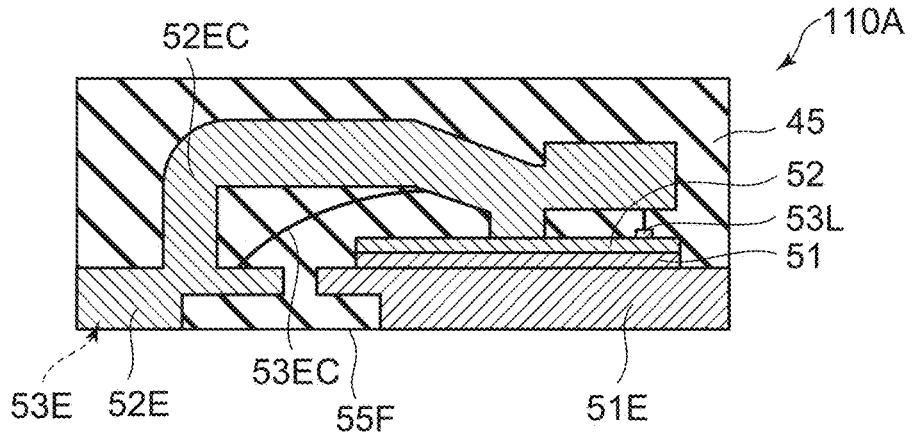
FIG. 5 is a schematic cross-sectional view illustrating a semiconductor device according to the first embodiment.

FIG. 5 is a schematic cross-sectional view illustrating a semiconductor device according to the first embodiment.

Figure 6:
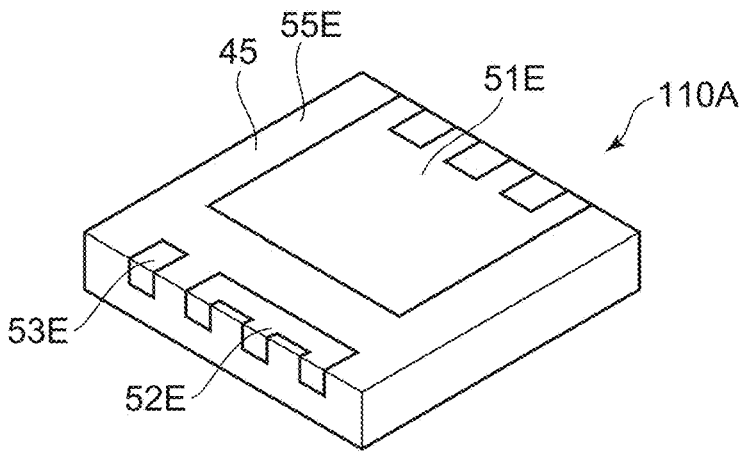
FIG. 6 is a schematic perspective view illustrating the semiconductor device according to the first embodiment.

FIG. 6 is a schematic perspective view illustrating the semiconductor device according to the first embodiment.

As shown in FIG. 5 and FIG. 6, the semiconductor device 110A according to the embodiment includes a resin member 45. Except for this, the configuration of the semiconductor device 110A may be the same as the configuration of the semiconductor device 110 (or the semiconductor device 110a).

As shown in FIG. 5, the resin member 45 is provided around the second conductive member 52. The resin member 45 includes a first element face 55F. In the semiconductor device 110A, the first conductive member 51 (for example, a drain electrode) is located between the first element face 55F and the second conductive member 52 (for example, a source electrode). The semiconductor device 110A is a drain-down semiconductor package. The first element face 55F is a mounting face of the semiconductor device 110A.

As shown in FIG. 6, the first electrode terminal 51E, the second electrode terminal 52E, and the third electrode terminal 53E are exposed at the first element face 55F. At least a part of the first electrode terminal 51E, at least a part of the second electrode terminal 52E, and at least a part of the third electrode terminal 53E are not covered with the resin member 45. In the cross-sectional view of FIG. 5, a part of the second electrode terminal 52E overlaps the third electrode terminal 53E. The drain-down semiconductor package has the structure of a general semiconductor device. Handling is easy.

Figure 7:
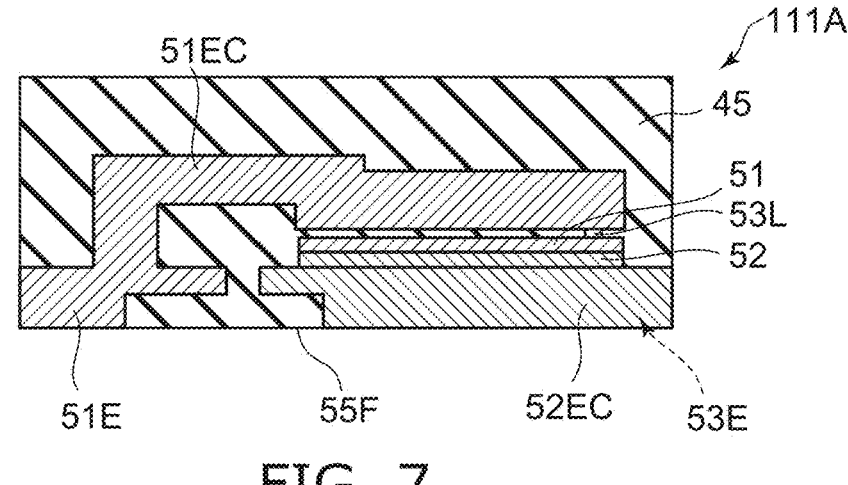
FIG. 7 is a schematic cross-sectional view illustrating a semiconductor device according to the first embodiment.

FIG. 7 is a schematic cross-sectional view illustrating a semiconductor device according to the first embodiment.

Figure 8:
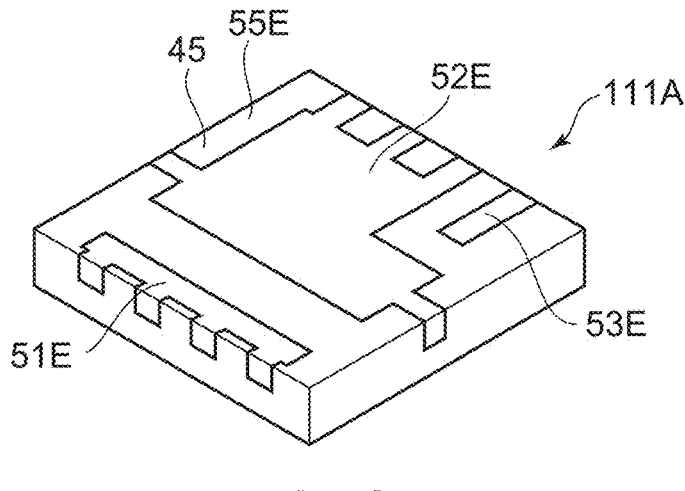
FIG. 8 is a schematic perspective view illustrating the semiconductor device according to the first embodiment.

FIG. 8 is a schematic perspective view illustrating the semiconductor device according to the first embodiment.

As shown in FIG. 7 and FIG. 8, a semiconductor device 111A according to the embodiment includes the resin member 45. Except for this, the configuration of the semiconductor device 111A may be the same as the configuration of the semiconductor device 111.

As shown in FIG. 7, the resin member 45 is provided around the first conductive member 51. The resin member 45 includes the first element face 55F. In the semiconductor device 111A, the second conductive member 52 (for example, a source electrode) is located between the first element face 55F and the first conductive member 51 (for example, a drain electrode). The semiconductor device 111A is a source-down semiconductor package. The first element face 55F is a mounting face of the semiconductor device 110A.

As shown in FIG. 8, the first electrode terminal 51E, the second electrode terminal 52E, and the third electrode terminal 53E are exposed at the first element face 55F. The resin member 45 includes the first element face 55F. At least a part of the first electrode terminal 51E, at least a part of the second electrode terminal 52E, and at least a part of the third electrode terminal 53E are not covered with the resin member 45. In the cross-sectional view of FIG. 7, a part of the second electrode terminal 52E overlaps the third electrode terminal 53E. High heat dissipation is obtained in a source-down semiconductor package. For example, it is easy to obtain a low wiring resistance. For example, it is easy to obtain a low contact resistance. For example, it is easy to obtain a low thermal resistance.

Figure 9:
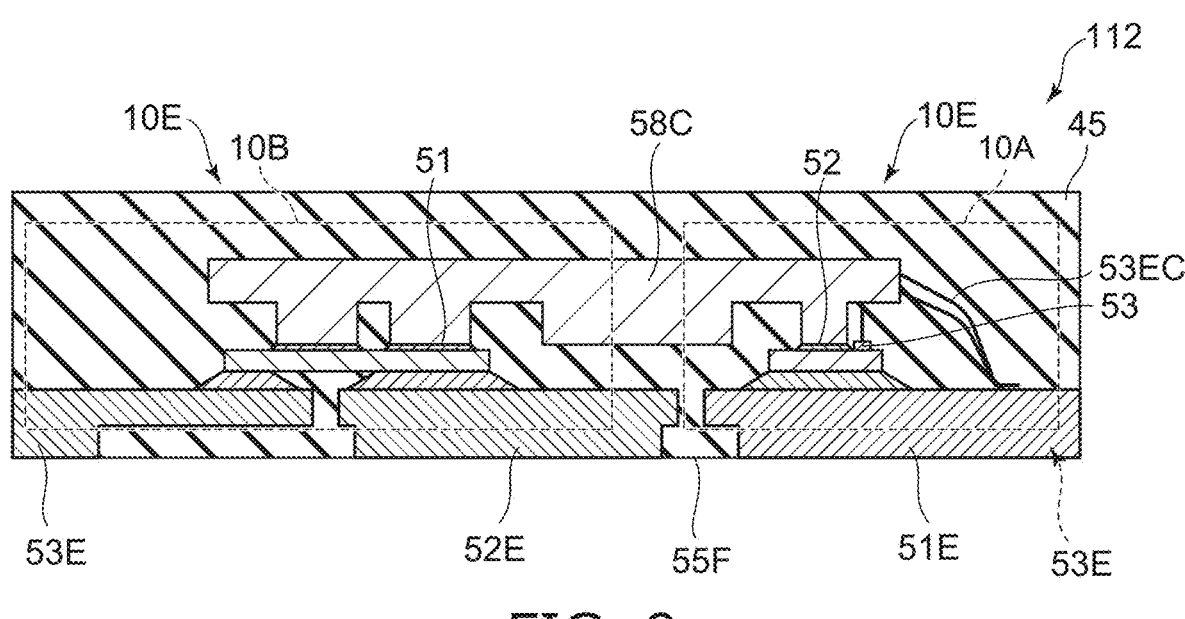
FIG. 9 is a schematic cross-sectional view illustrating a semiconductor device according to the first embodiment.

FIG. 9 is a schematic cross-sectional view illustrating a semiconductor device according to the first embodiment.

As shown in FIG. 9, a semiconductor device 112 according to the embodiment includes the first element 10A illustrated in FIG. 1 and the second element 10B illustrated in FIG. 4. The first element 10A is a drain-down semiconductor device. The second element 10B is, for example, a source-down semiconductor device. The resin member 45 is provided around the plurality of elements 10E (first element 10A and second element 10B). The first element 10A may have the configuration of the semiconductor device 110A. The second element 10B may have the configuration of the semiconductor device 111A.

As described above, the semiconductor device 112 includes the first element 10A and the second element 10B. The first element 10A has, for example, the configuration illustrated in FIG. 1. The second element 10B has the configuration illustrated in FIG. 4.

As shown in FIG. 4, in the second element 10B, the third conductive member wiring 53L passes through the second position ps2. The second element 10B includes the first conductive member 51 of the second element 10B, the second conductive member 52 of the second element 10B, the first semiconductor member 11 of the second element 10B, the third conductive member 53 of the second element 10B, and the third conductive member wiring 53L of the second element 10B.

As shown in FIG. 4, the first conductive member 51 of the second element 10B includes the first conductive portion 51a of the second element 10B including the first face f1 of the second element 10B, and a second conductive portion 51b of the second element 10B including the second face f2 of the second element 10B. The first face f1 of the second element 10B extends along the first direction D1 of the second element 10B and the second direction D2 of the second element 10B. The second direction D2 of the second element 10B crosses the first direction D1 of the second element 10B. The second face f2 of the second element 10B extends along the second direction D2 of the second element 10B and the third direction D3 of the second element 10B. The third direction D3 of the second element 10B crosses the above described plane (D1-D2 plane).

As shown in FIG. 4, the second conductive member 52 of the second element 10B includes the third conductive portion 52c of the second element 10B including the third face f3 of the second element 10B, and the fourth conductive portion 52d of the second element 10B including the fourth face f4 of the second element 10B. The third face f3 of the second element 10B extends along the first direction D1 of the second element 10B and the second direction D2 of the second element 10B. The fourth face f4 of the second element 10B extends along the second direction D2 of the second element 10B and the third direction D3 of the second element 10B. The direction from the first conductive portion 51a of the second element 10B to the third conductive portion 52c of the second element 10B is along the third direction D3 of the second element 10B. The direction from the second conductive portion 51b of the second element 10B to the fourth conductive portion 52d of the second element 10B is along the first direction D1 of the second element 10B. The fourth conductive portion 52d of the second element 10B includes the facing conductive portion 52f of the second element 10B.

As shown in FIG. 4, the first semiconductor member 11 of the second element 10B is of the first conductive type. The first semiconductor member 11 of the second element 10B is located between the first conductive portion 51a of the second element 10B and the third conductive portion 52c of the second element 10B in the third direction D3 of the second element 10B. The first semiconductor member 11 of the second element 10B is located between the second conductive portion 51b of the second element 10B and the fourth conductive portion 52d of the second element 10B in the first direction D1 of the second element 10B.

As shown in FIG. 4, the first semiconductor member 11 of the second element 10B includes the first partial region 11a of the second element 10B, the second partial region 11b of the second element 10B, and the third partial region 11c of the second element 10B. The direction from the first partial region 11a of the second element 10B to the second partial region 11b of the second element 10B is along the second direction D2 of the second element 10B. The third partial region 11c of the second element 10B is located between the first partial region 11a of the second element 10B and the facing conductive portion 52f of the second element 10B in the first direction D1 of the second element 10B. The third partial region 11c of the second element 10B includes the facing face 11cf of the second element 10B facing the facing conductive portion 52f of the second element 10B. The facing face 11cf of the second element 10B contacts the facing conductive portion 52f of the second element 10B.

As shown in FIG. 4, the direction from the facing face 11cf of the second element 10B to the third conductive member 53 of the second element 10B is along the second direction D2 of the second element 10B.

As shown in FIG. 4, the third conductive member wiring 53L of the second element 10B is electrically connected to the third conductive member 53 of the second element 10B. At least a part of the third conductive member wiring 53L of the second element 10B passes through a position (second position ps2 of the second element 10B) between the first semiconductor member 11 of the second element 10B and the first conductive portion 51a of the second element 10B.

In FIG. 9, the third electrode terminal 53E of the first element 10A overlaps the first electrode terminal 51E of the first element 10A.

In the embodiment, the second element 10B is electrically connected in series with the first element 10A. The second conductive member 52 of the first element 10A and the first conductive member 51 of the second element 10B are electrically connected by a connecting conductive member 58C. For example, a current flows in a path passing through the first electrode terminal 51E of the first element 10A, the second conductive member 52 of the first element 10A, the connecting conductive member 58C, the first conductive member 51 of the second element 10B, and the second electrode terminal 52E of the second element 10B.

Figure 10:
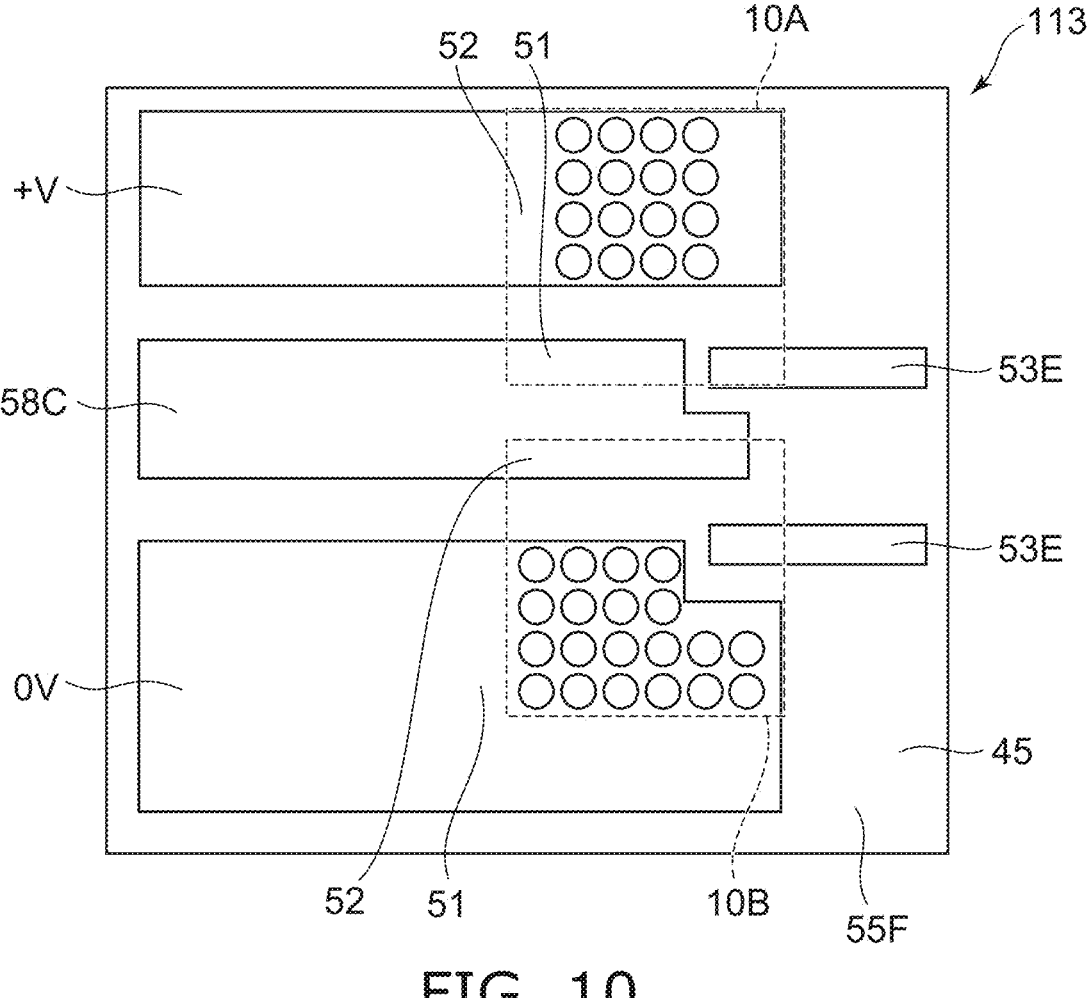
FIG. 10 is a schematic plan view illustrating a semiconductor device according to the first embodiment.

FIG. 10 is a schematic plan view illustrating a semiconductor device according to the first embodiment.

FIG. 10 illustrates the first element face 55F of a semiconductor device 113 according to the embodiment. The semiconductor device 113 includes the first element 10A and the second element 10B. The first element 10A is the drain-down semiconductor device. The second element 10B is, for example, the source-down semiconductor device. By the connecting conductive member 58C, the first conductive member 51 of the first element 10A is electrically connected to the second conductive member 52 of the second element 10B. The connecting conductive member 58C is, for example, a switch node.

The first conductive member 51 of the second element 10B is set to a reference potential (Ground potential, 0 V), for example. The second conductive member 52 of the first element 10A is set to a high potential (+V), for example. The first element 10A is, for example, a high-side element. The second element 10B is, for example, a low-side element.

In the source-down semiconductor device, for example, the area of the source-side portion is easily increased. By using the source-down semiconductor device for the low-side element, for example, high heat dissipation is easily obtained. For example, the switch node (connecting conductive member 58C) can be made narrow. For example, radiation noise can be reduced.

FIGS. 11, 12A, 12B, 13, 14A, 14B, 15A and 15B are schematic views illustrating a method of manufacturing the semiconductor device according to the first embodiment.

FIGS. 11, 13, 15A and 15B are perspective views. FIGS. 12A, 12B, 14A and 14B are cross-sectional views. FIGS. 12A, 12B, 14A, and 14B correspond to a cross section of a portion including the first semiconductor member 11.

Figure 11:
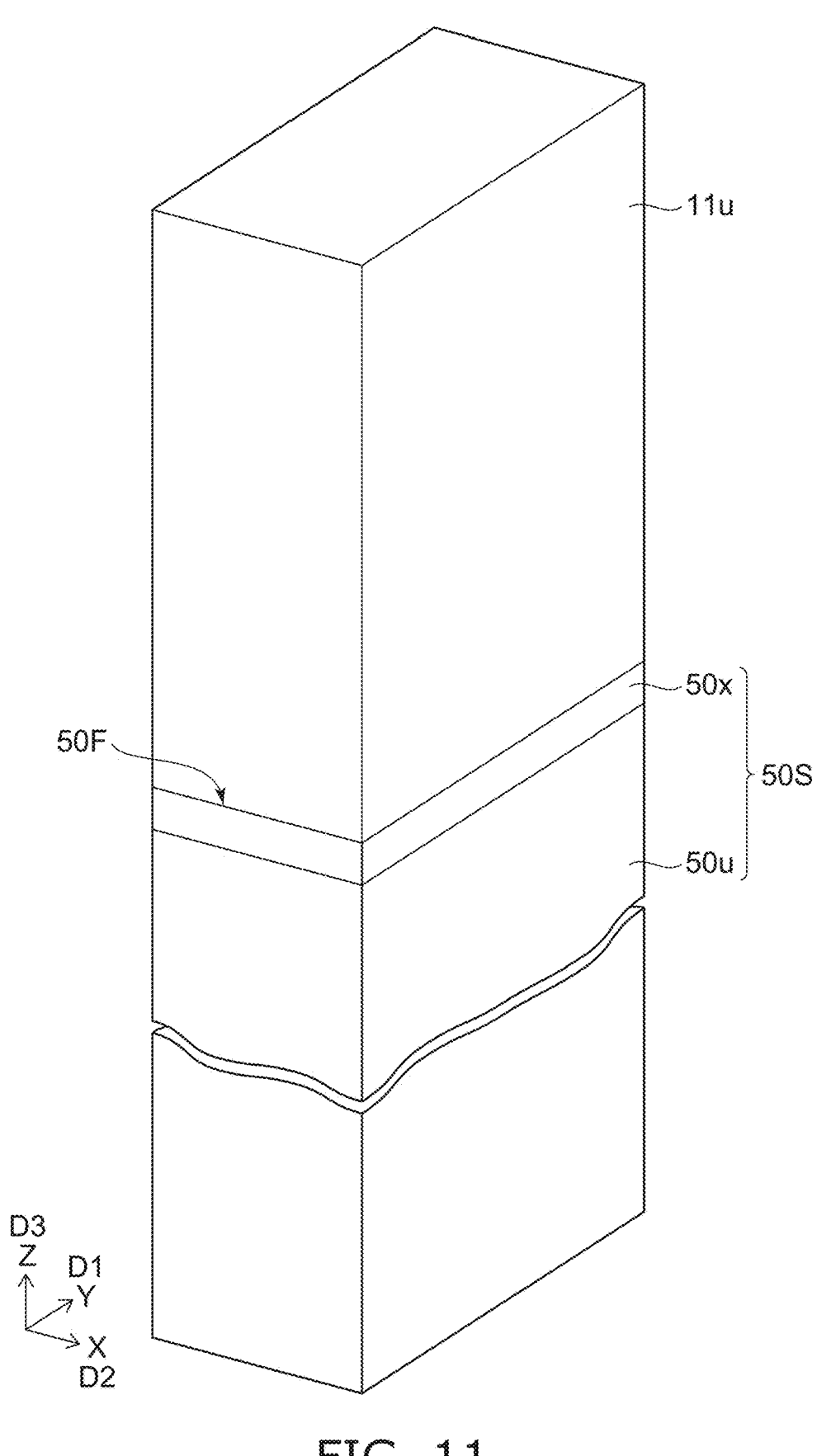
FIG. 11 is a schematic view illustrating a method of manufacturing the semiconductor device according to the first embodiment.

As shown in FIG. 11, a support body 50S and a semiconductor layer 11u are prepared. The semiconductor layer 11u is provided on the support face 50F of the support body 50S. The semiconductor layer 11u becomes the first semiconductor member 11. The support body 50S includes a substrate portion 50u and an insulating layer 50x. The substrate portion 50u is, for example, a silicon substrate. The insulating layer 50x is provided on the substrate portion 50u. The insulating layer 50x is, for example, a silicon oxide layer (for example, a thermal oxide film). The upper surface of the insulating layer 50x corresponds to the support face 50F. As described later, the insulating layer 50x may be served as the second insulating member 42 or the third insulating member 43.

Figure 12A:
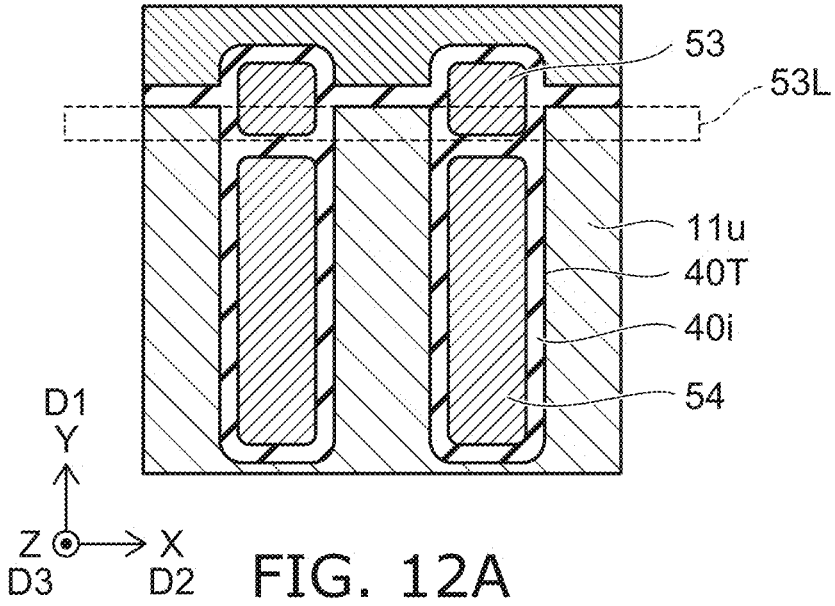
FIG. 12A and FIG. 12B are schematic views illustrating a method of manufacturing the semiconductor device according to the first embodiment.

As shown in FIG. 12A, a part of the semiconductor layer 11u is removed by photolithography and RIE (Reactive Ion Etching) to form a trench 40T. The trench 40T extends in the Z-axis direction.

After that, an insulating film 40i (e.g., silicon oxide) is formed inside the trench 40T, and a conductive material (e.g., polysilicon) is buried in the remaining region by CVD (Chemical Vapor Deposition) or the like. The first insulating member 41 is obtained from the insulating film 40i. The third conductive member 53, the fourth conductive member 54, and the third conductive member wiring 53L are obtained from the conductive material.

Figure 12B:
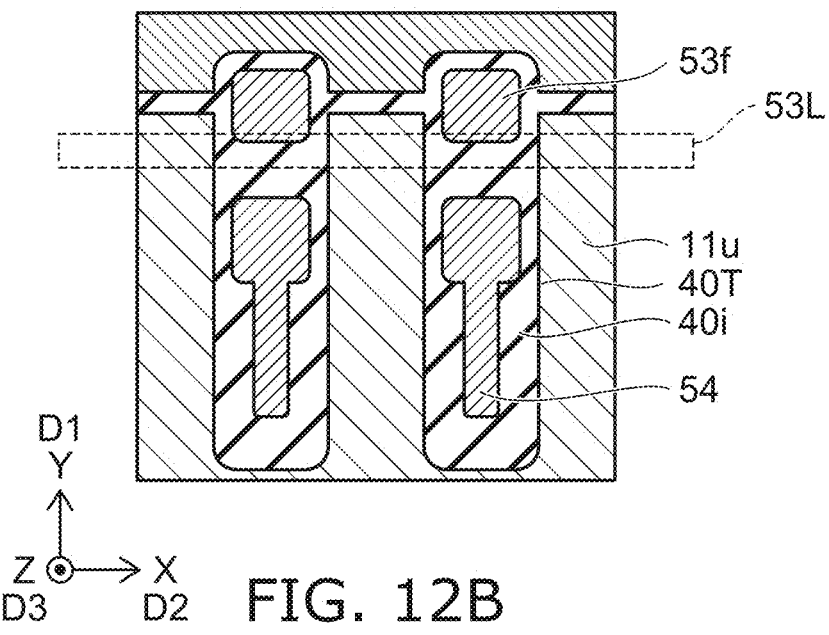

In this example, as shown in FIG. 12B, a part of the fourth conductive member 54 may be removed to reduce the width of a part of the fourth conductive member 54. Thereafter, an insulating film 40i (e.g., silicon oxide) is formed in the trench 40T.

Figure 13:
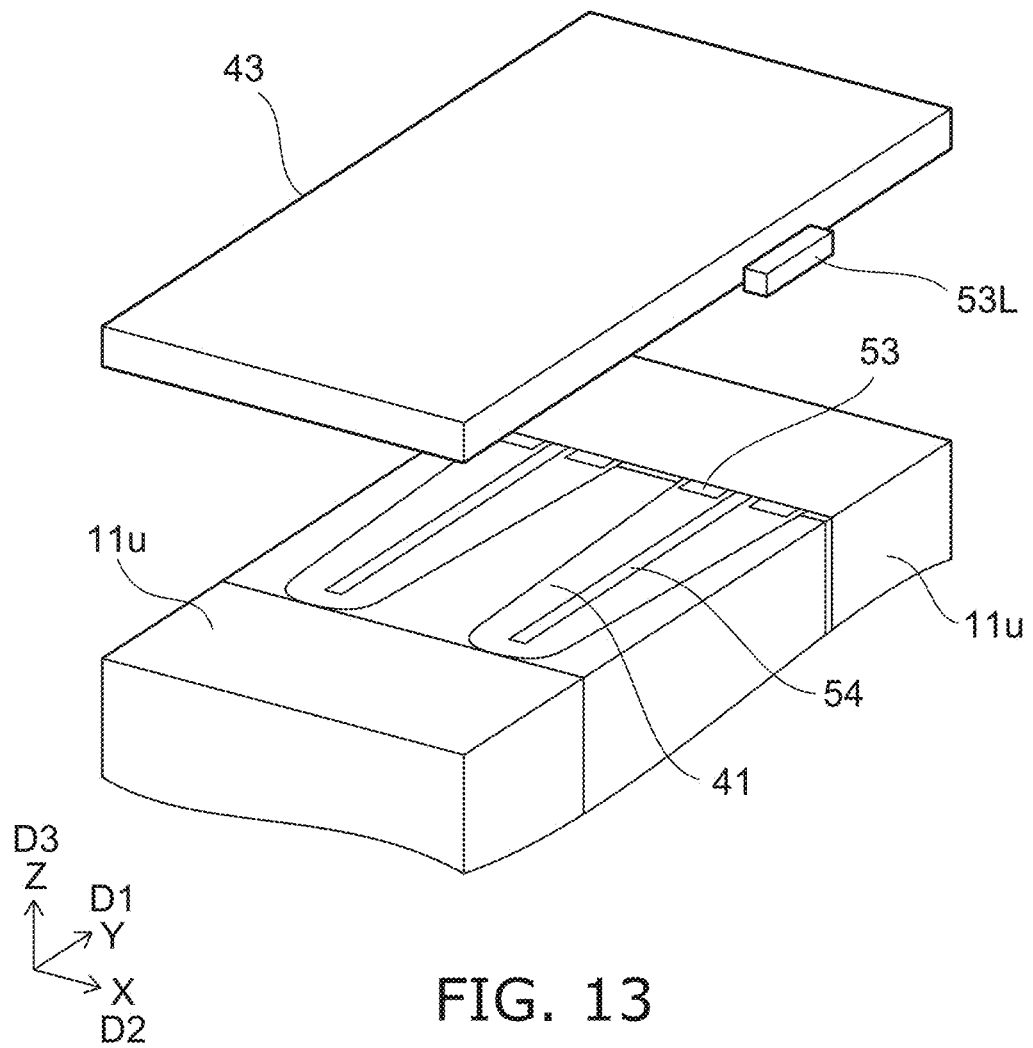
FIG. 13 is a schematic view illustrating a method of manufacturing the semiconductor device according to the first embodiment.

As a result, as shown in FIG. 13, the third insulating member 43 is formed. In FIG. 13, the intermediate connect portion 53C is omitted.

Figure 14A:
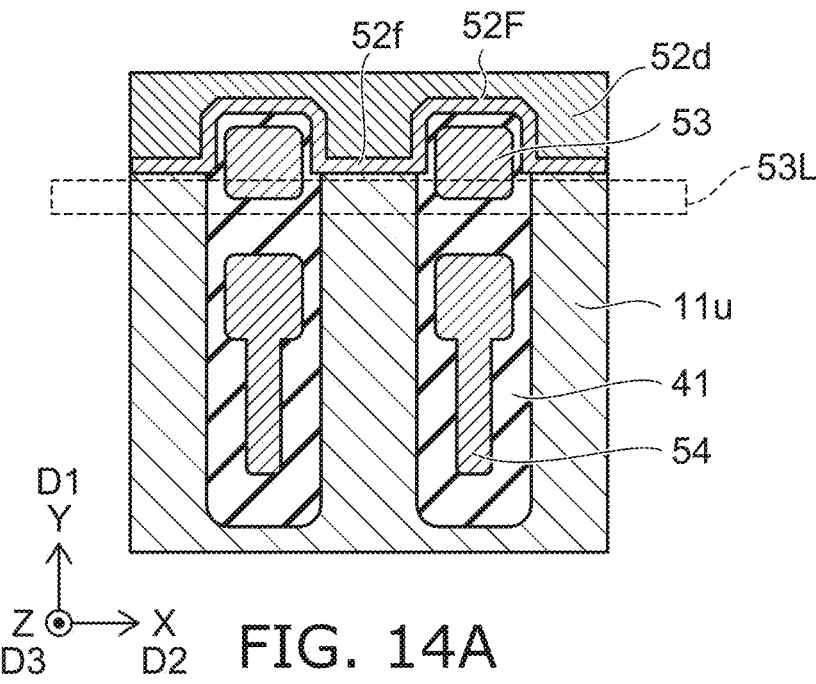
FIG. 14A and FIG. 14B are schematic views illustrating a method of manufacturing the semiconductor device according to the first embodiment.

After that, as shown in FIG. 14A, a part of the semiconductor layer 11$u$ is removed, and a metal film 52F (for example, a Ti film) or the like is formed in the removed portion. A part of the fourth conductive portion 52$d$ is obtained from the metal film 52F. A part of the fourth conductive portion 52$d$ becomes a facing conductive portion 52$f$. By forming a metal film on the surface of the metal film 52F, the fourth conductive portion 52$d$ is obtained.

Figure 14B:
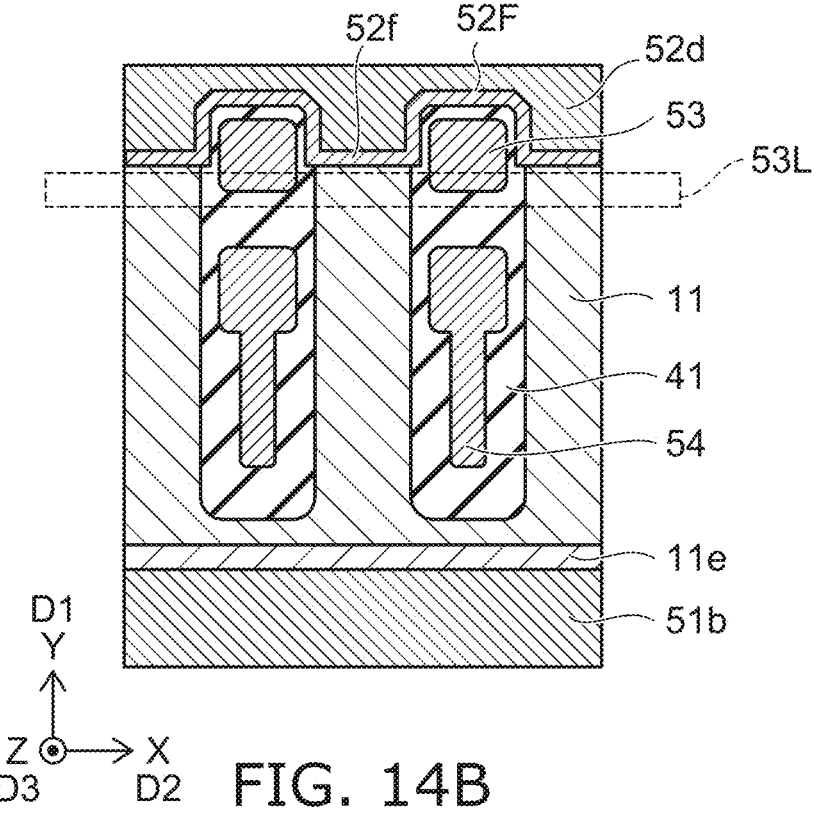

As shown in FIG. 14B, a part of the semiconductor layer 11$u$ is removed. In this example, an impurity of the first conductive type is introduced into the removed part of the semiconductor layer 11$u$. As a result, the fifth partial region 11$e$ is formed. A conductive film is formed on the surface of the fifth partial region 11$e$. As a result, the second conductive portion 51$b$ is formed (see FIG. 15A).

Figure 15A:
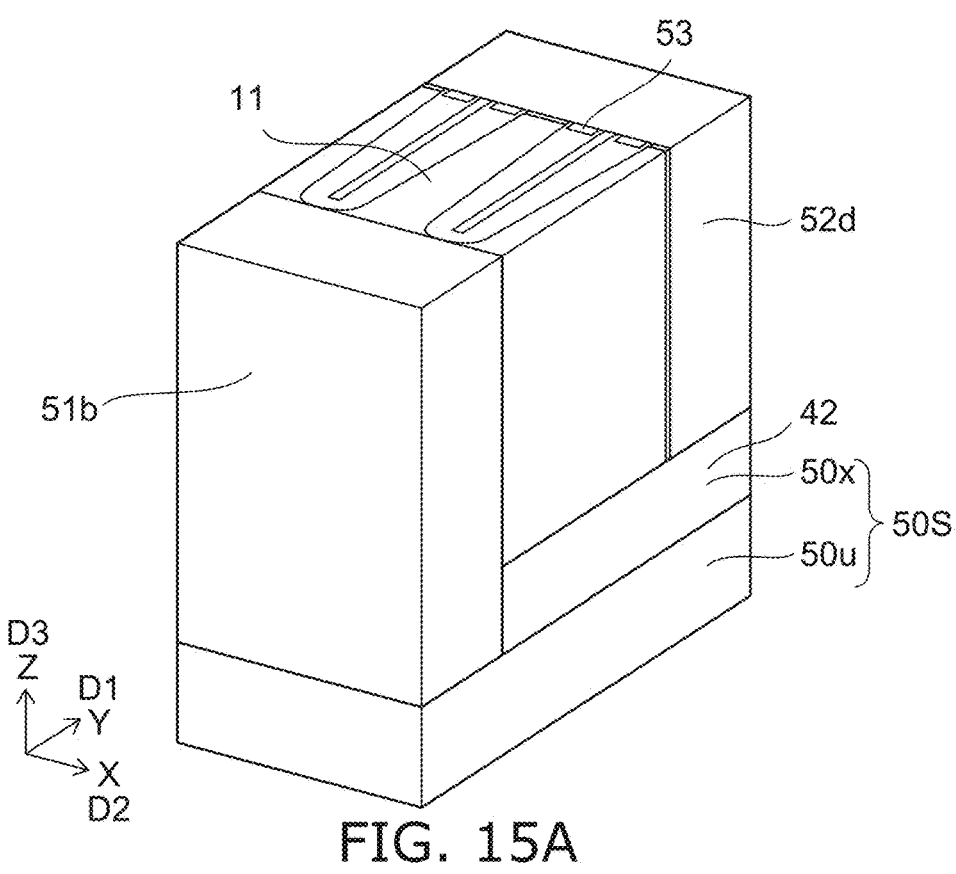
FIG. 15A and FIG. 15B are schematic views illustrating a method of manufacturing the semiconductor device according to the first embodiment.

As shown in FIG. 15A, the insulating layer 50$x$ serves as the second insulating member 42.

Figure 15B:
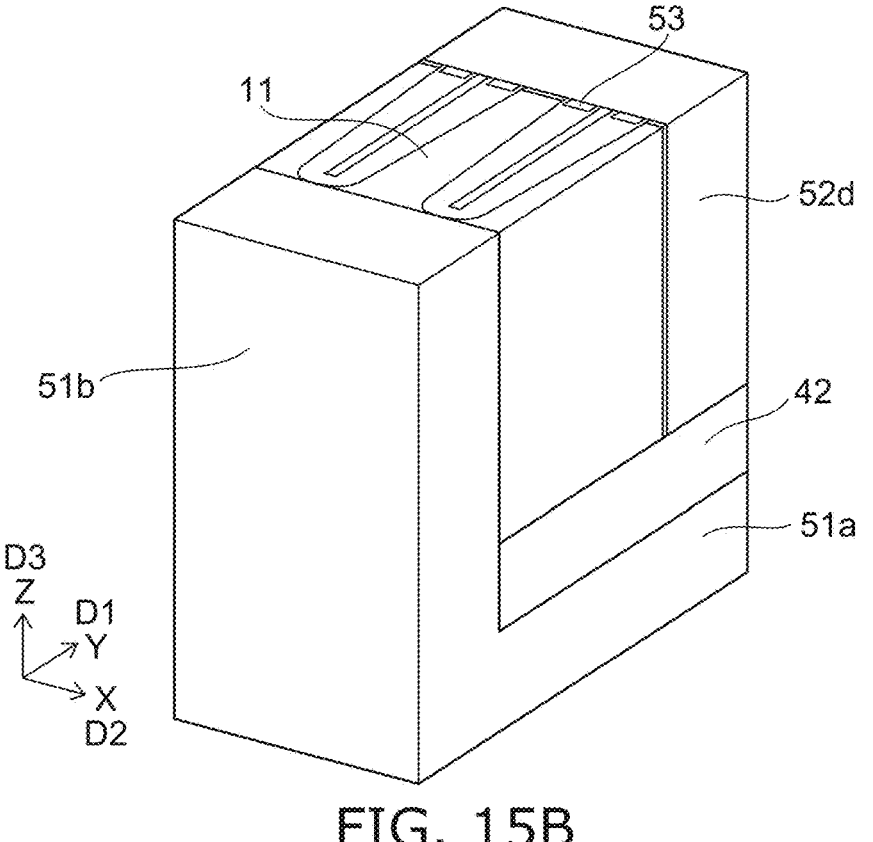

As shown in FIG. 15B, the substrate portion 50$u$ is removed. A conductive film is formed on a surface of the second insulating member 42 exposed by removing the substrate portion 50$u$. As a result, in this example, the first conductive portion 51$a$ is formed. The conductive film may be formed by sputtering or plating. In this example, the first conductive portion 51$a$ is electrically connected to the second conductive portion 51$b$.

On the other hand, a conductive layer is provided on an insulating member provided on the first semiconductor member 11. The conductive layer is electrically connected to the fourth conductive portion 52$d$. As a result, the first element 10A (semiconductor device 110) illustrated in FIG. 1 is obtained.

Figure 16A:
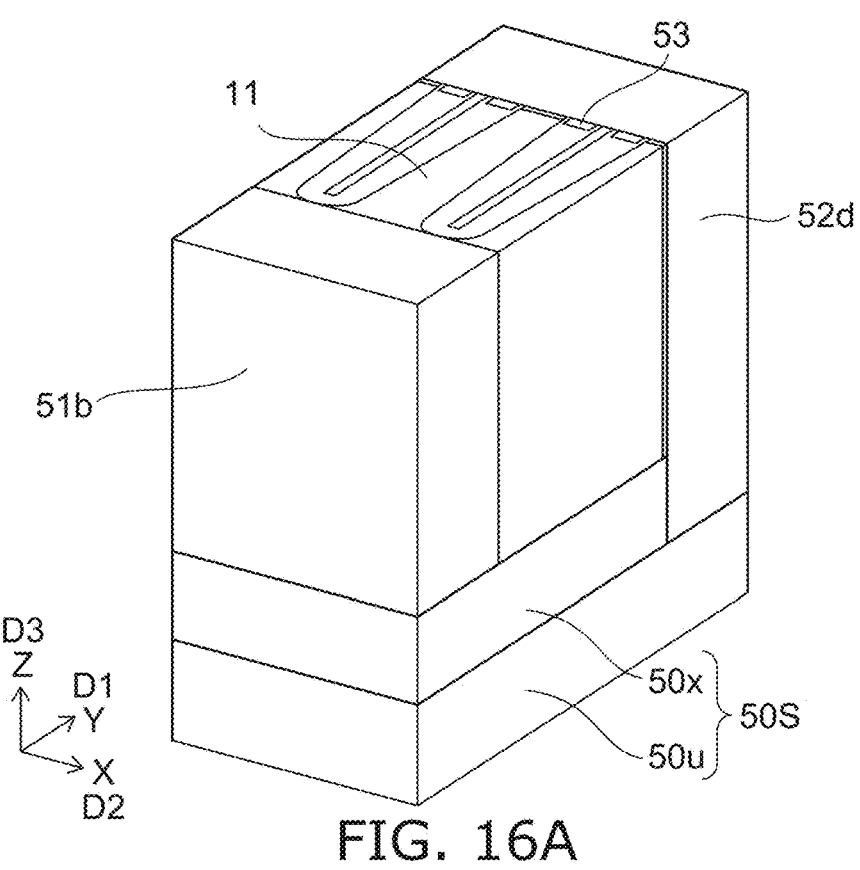
FIG. 16A and FIG. 16B are schematic perspective views illustrating a method of manufacturing the semiconductor device according to the first embodiment.
Figure 16B:
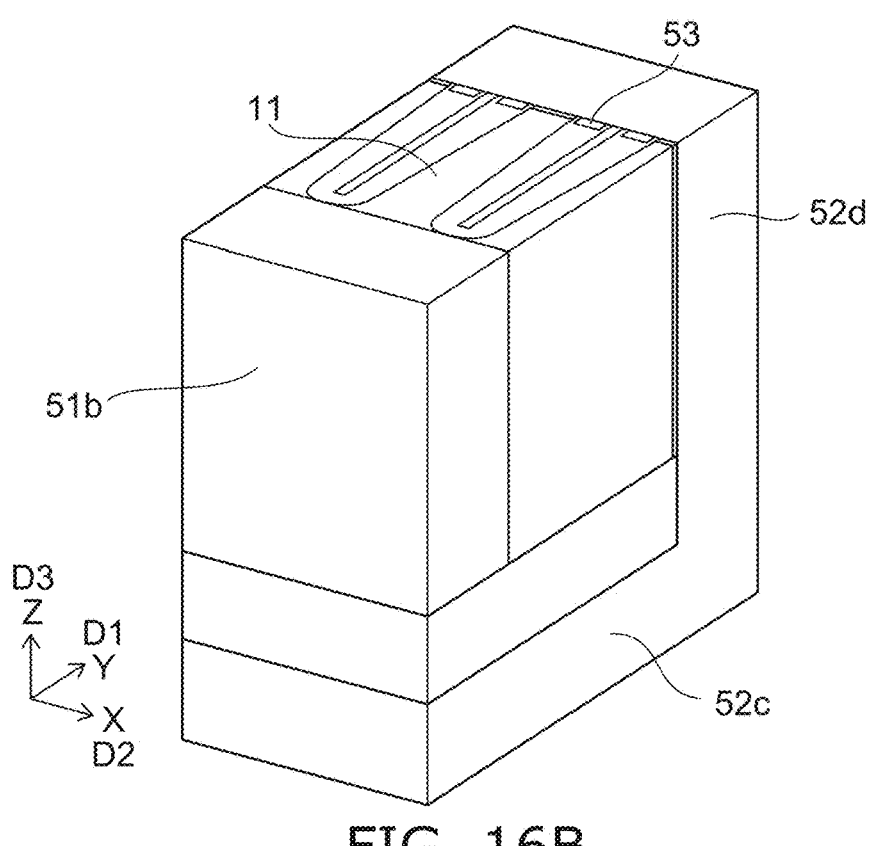

FIG. 16A and FIG. 16B are schematic perspective views illustrating a method of manufacturing the semiconductor device according to the first embodiment.

FIGS. 16A and 16B correspond to FIGS. 15A and 15B. As shown in FIG. 16A, after the step of FIG. 14A, the second conductive portion 51$b$ is formed on the insulating layer 50$x$ (the second insulating member 42), and the fourth conductive portion 52$d$ is formed in contact with the substrate portion 50$u$. Such a change can be performed, for example, by changing the pattern of the mask.

As shown in FIG. 16B, the substrate portion 50$u$ is removed. A conductive film is formed on a surface of the second insulating member 42 exposed by removing the substrate portion 50$u$. As a result, in this example, the third conductive portion 52$c$ is formed. The third conductive portion 52$c$ is electrically connected to the fourth conductive portion 52$d$.

On the other hand, a conductive layer is provided on a conductive member provided on the first semiconductor member 11. The conductive layer is electrically connected to the second conductive portion 51$b$. As a result, the first element 10A (semiconductor device 111) illustrated in FIG. 3 is obtained.

By changing the pattern of the mask used for processing, the semiconductor device 110 and the semiconductor device 111 can be easily manufactured. For example, the drain-down semiconductor package or the source-down semiconductor package can be easily obtained.

Figure 17:
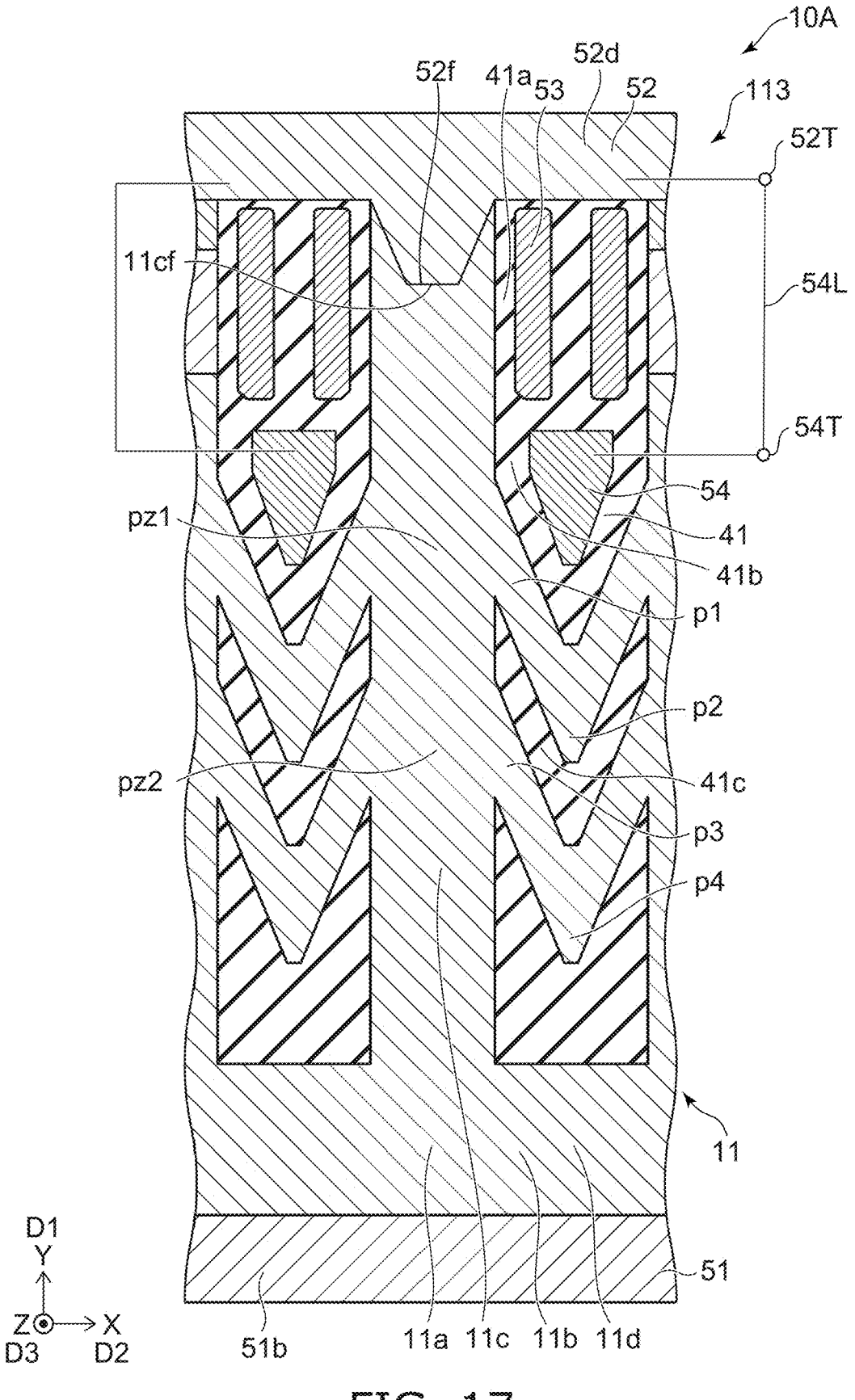
FIG. 17 is a schematic cross-sectional view illustrating a semiconductor device according to the first embodiment.

FIG. 17 is a schematic cross-sectional view illustrating a semiconductor device according to the first embodiment.

As shown in FIG. 17, a semiconductor device 113 according to the embodiment includes the first element 10A. In this example, the first element 10A also includes the first conductive member 51, the second conductive member 52, the third conductive member 53, the first semiconductor member 11, and the third conductive member wiring 53L. In the semiconductor device 113, the first semiconductor member 11 includes a first portion p1 and a second portion p2. Except for this, the configuration of the semiconductor device 113 may be the same as the configuration of the semiconductor device 110 or 111.

The third partial region 11$c$ includes a first position portion pz1. The first position portion pz1 is located between the first partial region 11$a$ and the facing face 11$cf$ in the first direction D1.

The first portion p1 is connected with the first position portion pz1. The second portion p2 is connected with the first portion p1. A position of the second portion p2 in the first direction D1 is between a position of the second partial region 11$b$ in the first direction D1 and a position of the first portion p1 in the first direction D1. A position of the first portion p1 in the second direction D2 is between a position of the third partial region 11$c$ in the second direction D2 and a position of the second portion p2 in the second direction D2. A direction from the first portion p1 to the second portion p2 is inclined with respect to the first direction D1.

By providing such the first portion p1 and the second portion p2, local concentration of the electric field can be suppressed. More stable operation is obtained.

As shown in FIG. 17, the third partial region 11$c$ may further include a second position portion pz2. The second position portion pz2 is located between the first partial region 11$a$ and the first position portion pz1. A direction from the second position portion pz2 to the second portion p2 is along the second direction D2. A part of the first insulating member 41 is located between the second position portion pz2 and the second portion p2 in the second direction D2. Another part of the first insulating member 41 is provided between the first portion p1 and the fourth conductive member 54, and between the second portion p2 and the fourth conductive member 54.

As shown in FIG. 17, the first semiconductor member 11 includes a third portion p3 and a fourth portion p4. The configuration of the third portion p3 and the fourth portion p4 may be the same as the configuration of the first portion p1 and the second portion p2. The third portion p3 is located between the second partial region 11$b$ and the first portion p1 in the first direction D1. The fourth portion p4 is located between the second partial region 11$b$ and the second portion p2 in the first direction D1. A direction from the third portion p3 to the fourth portion p4 is inclined with respect to the first direction D1. By providing a plurality of inclined portions, concentration of the electric field can be further suppressed.

Figure 18:
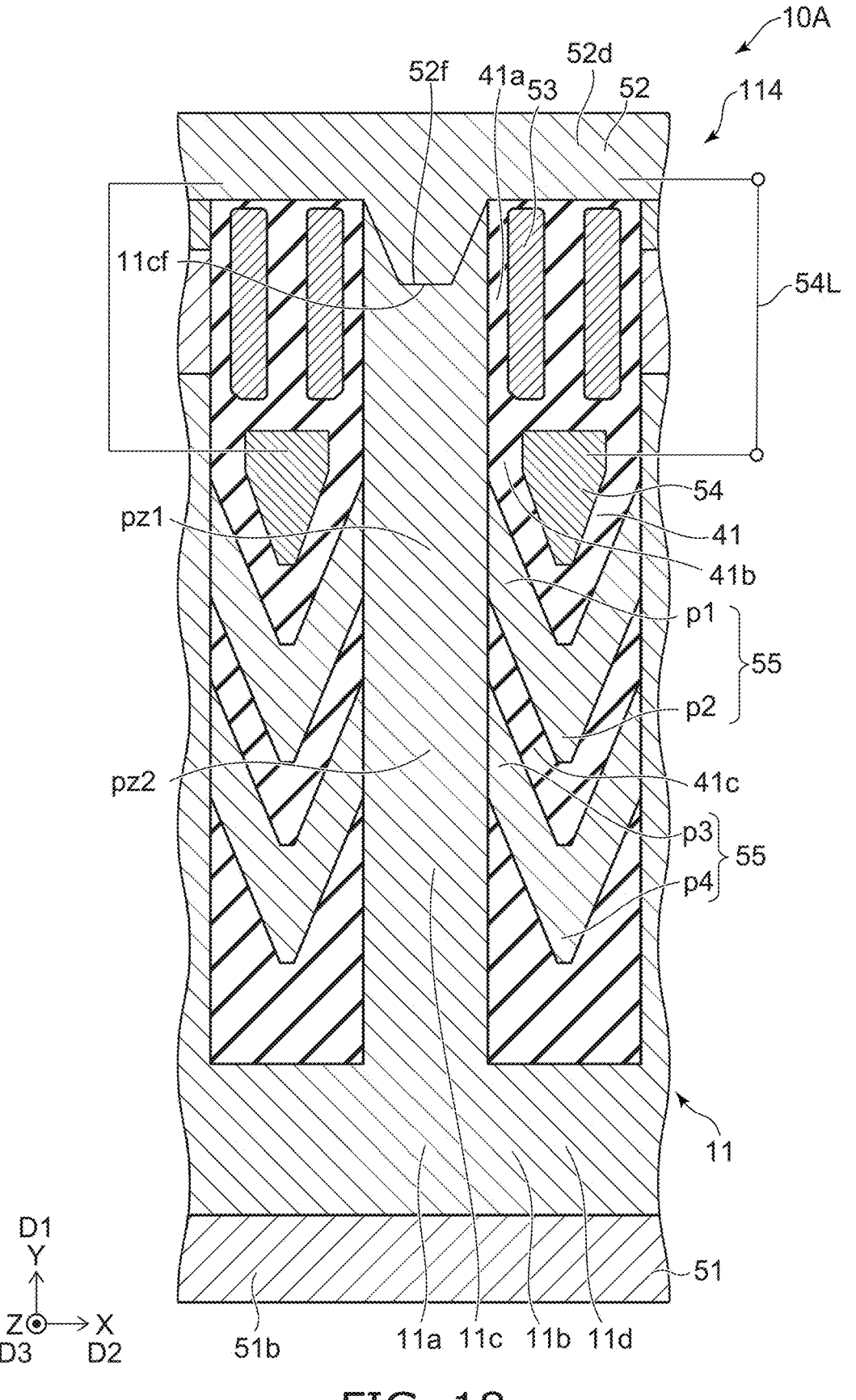
FIG. 18 is a schematic cross-sectional view illustrating a semiconductor device according to the first embodiment.

FIG. 18 is a schematic cross-sectional view illustrating a semiconductor device according to the first embodiment.

As shown in FIG. 18, a semiconductor device 114 according to the embodiment includes the first element 10A. In this example, the first element 10A includes the first conductive member 51, the second conductive member 52, the third conductive member 53, the first semiconductor member 11, the third conductive member wiring 53L, and the fifth conductive member 55. The fifth conductive member 55 includes the first portion p1, the second portion p2, the third portion p3, the fourth portion p4, and the like. Except for this, the configuration of the semiconductor device 114 may be the same as the configuration of the semiconductor device 113.

In the semiconductor device 114, the fifth conductive member 55 includes the first portion p1 and the second portion p2. The third partial region 11$c$ includes the first position portion pz1. The first position portion pz1 is located between the first partial region 11$a$ and the facing face 11$cf$ in the first direction D1. The first portion p1 is connected with the first position portion pz1. The second portion p2 is connected with the first portion p1. The position of the second portion p2 in the first direction D1 is between the position of the second partial region 11b in the first direction D1 and the position of the first portion p1 in the first direction D1. The position of the first portion p1 in the second direction D2 is between the position of the third partial region 11c in the second direction D2 and the position of the second portion p2 in the second direction D2.

By the first portion p1 and the second portion p2 being provided in the fifth conductive member 55, local concentration of the electric field can be suppressed. More stable operation is obtained.

In the semiconductor device 114, the third partial region 11c may further include a second position portion pz2. The second position portion pz2 is located between the first partial region 11a and the first position portion pz1. The direction from the second position portion pz2 to the second portion p2 is along the second direction D2. A part of the first insulating member 41 is located between the second position portion pz2 and the second portion p2 in the second direction D2. Another part of the first insulating member 41 is provided between the first portion p1 and the fourth conductive member 54, and between the second portion p2 and the fourth conductive member 54.

As shown in FIG. 18, the fifth conductive member 55 may include the third portion p3 and the fourth portion p4. The configuration of the third portion p3 and the fourth portion p4 may be the same as the configuration of the first portion p1 and the second portion p2. The third portion p3 is located between the second partial region 11b and the first portion p1 in the first direction D1. The fourth portion p4 is located between the second partial region 11b and the second portion p2 in the first direction D1. The direction from the third portion p3 to the fourth portion p4 is inclined with respect to the first direction D1. By providing a plurality of inclined portions, concentration of the electric field can be further suppressed.

Second Embodiment

Figure 19A:
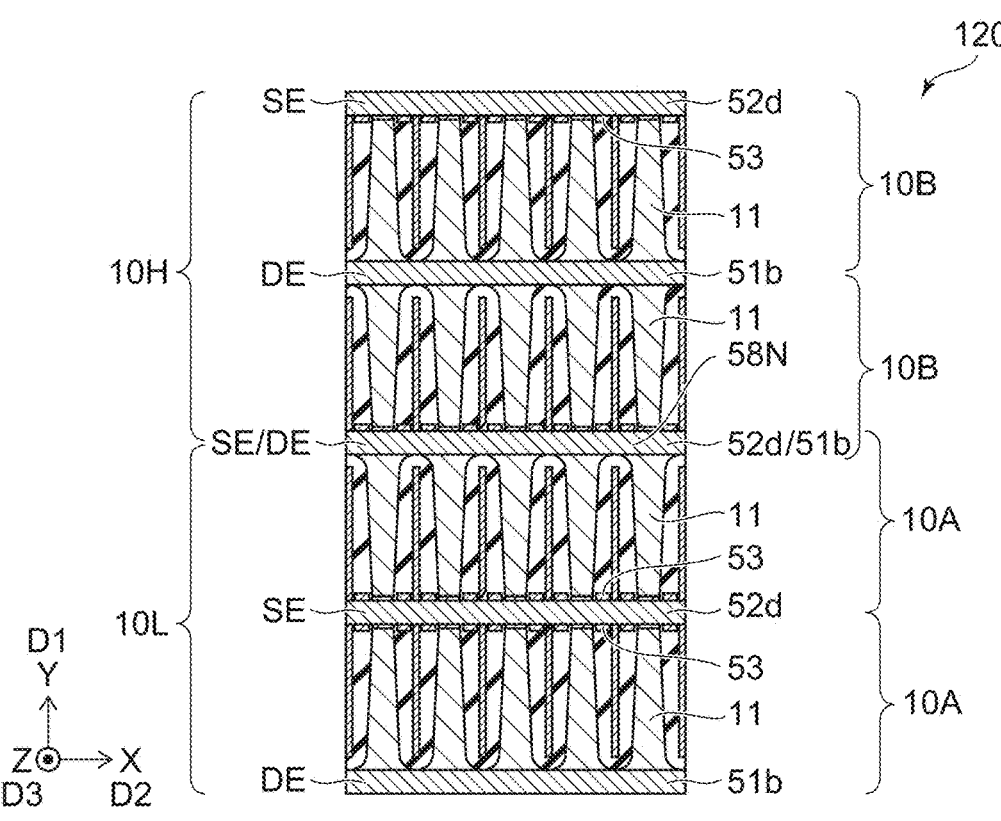
FIG. 19A and FIG. 19B are schematic diagrams illustrating a semiconductor device according to a second embodiment.
Figure 19B:
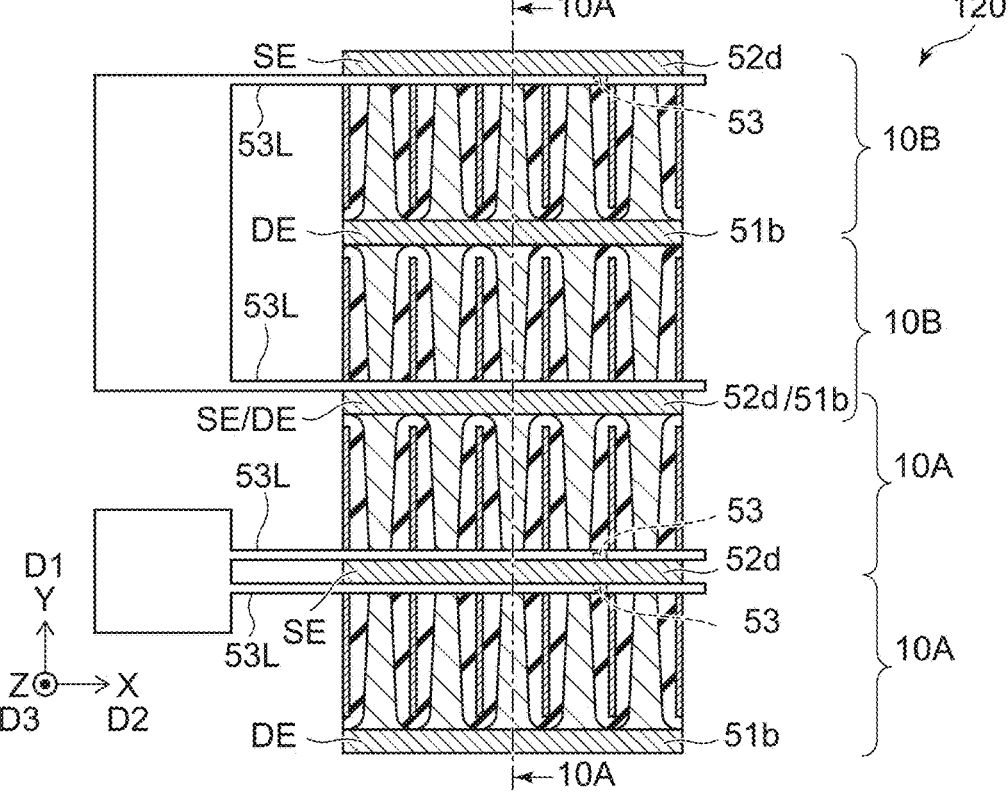

FIG. 19A and FIG. 19B are schematic diagrams illustrating a semiconductor device according to the second embodiment.

Figure 20:
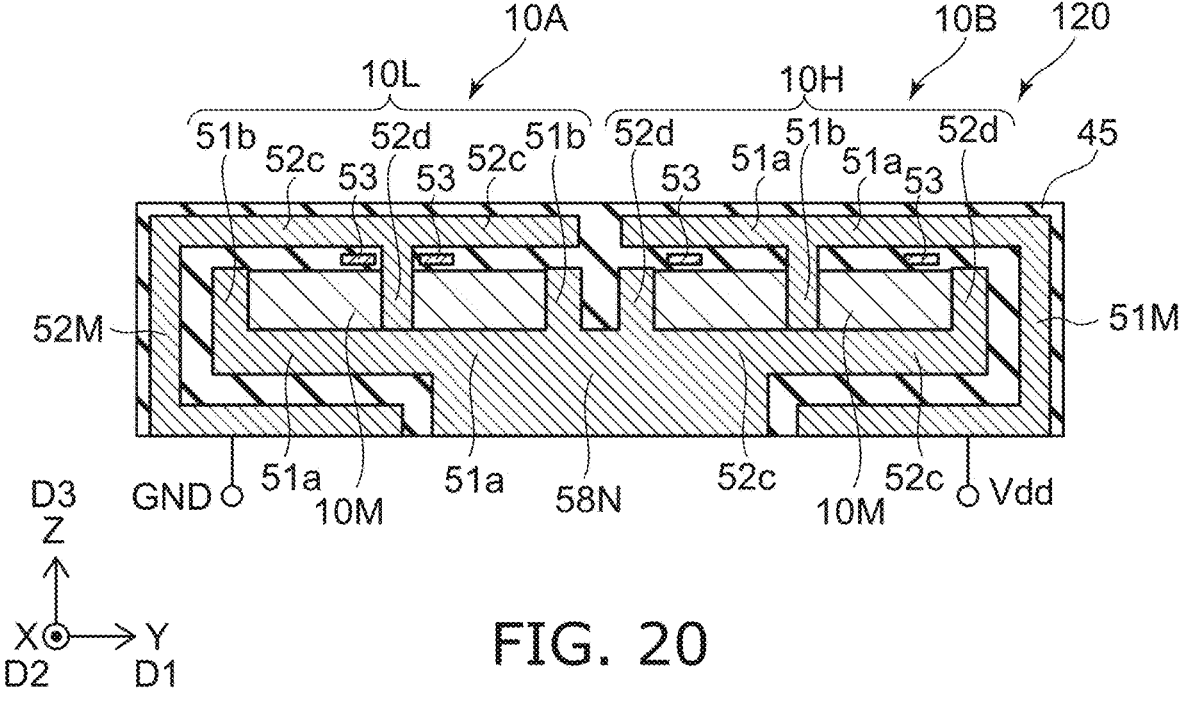
FIG. 20 is a schematic cross-sectional view illustrating the semiconductor device according to the second embodiment.

FIG. 20 is a schematic cross-sectional view illustrating the semiconductor device according to the second embodiment.

FIG. 20 corresponds to the Y1-Y2 cross section of FIG. 19B.

In FIG. 19A, the third conductive member wiring 53L is omitted. In FIG. 19B, the third conductive member wiring 53L is illustrated.

As shown in FIG. 19A, a semiconductor device 120 according to the embodiment includes the first element 10A and the second element 10B. In this example, two first elements 10A and two second elements 10B are provided.

The two first elements 10A are included in, for example, the high-side elements 10H. The two second elements 10B are included in the low-side elements 10L, for example.

As shown in FIG. 19A, the fourth conductive portion 52d of the second element 10B is located between one of the second conductive portions 51b of the second element 10B and the fourth conductive portion 52d of the first element 10A in the first direction D1. The second conductive portion 51b of the first element 10A is located between the fourth conductive portion 52d of the second element 10B and one of the second conductive portions 51b of the first element 10A in the first direction D1.

As shown in FIG. 19B, the third conductive member wiring 53L overlaps the third conductive member 53 in the third direction D3.

As shown in FIG. 19A and FIG. 20, the first element 10A includes a plurality of second conductive portions 51b of the first element 10A. The fourth conductive portion 52d of the first element 10A is located between one of the plurality of second conductive portions 51b of the first element 10A and another one of the plurality of second conductive portions 51b of the first element 10A.

The second element 10B includes a plurality of fourth conductive portions 52d of the second element 10B. The second conductive portion 51b of the second element 10B is located between one of the plurality of fourth conductive portions 52d of the second element 10B and another one of the plurality of fourth conductive portions 52d of the second element 10B.

As shown in FIG. 20, in the semiconductor device 120, a first conductive member electrode 51M and a second conductive member electrode 52M are provided. The first conductive member electrode 51M is electrically connected to the first conductive member 51 (second conductive portion 51b) of the second element 10B. The second conductive member electrode 52M is electrically connected to the second conductive member 52 (fourth conductive portion 52d) of the first element 10A.

The first element 10A and the second element 10B are electrically connected by a connection part 58N. For example, the first conductive member electrode 51M is connected to a high voltage (voltage Vdd). The second conductive member electrode 52M is connected to a low voltage (ground potential GND).

Figure 21:
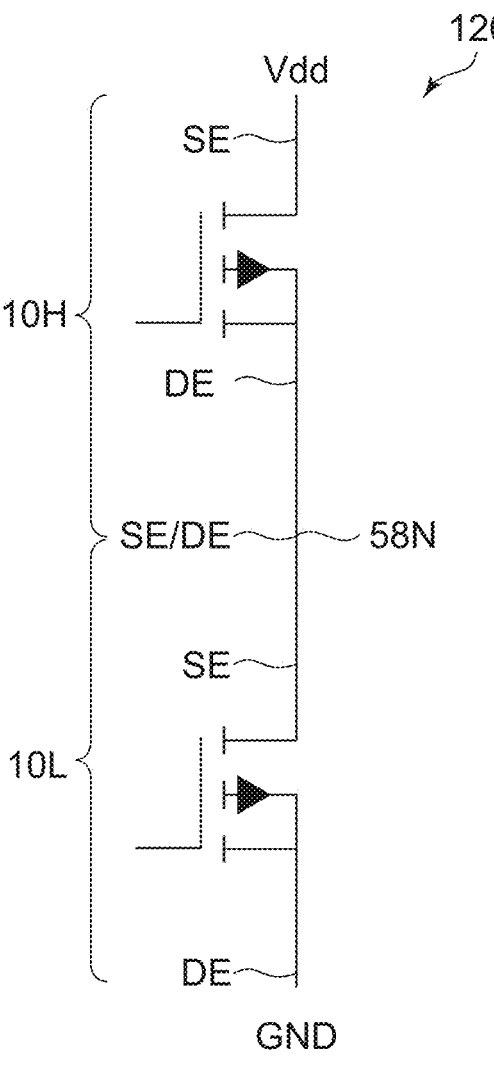
FIG. 21 is a circuit diagram illustrating the semiconductor device according to the second embodiment.

FIG. 21 is a circuit diagram illustrating the semiconductor device according to the second embodiment.

As shown in FIG. 21, the semiconductor device 120 includes a high-side element 10H and a low-side element 10L. These elements are connected in series. According to the semiconductor device 120 according to the embodiment, "2 in 1 package" can be easily obtained.

Embodiments may include the following configurations (e.g., technical proposals).

Configuration 1

A semiconductor device, comprising:
a first element, the first element including:
a first conductive member including a first conductive portion including a first face and a second conductive portion including a second face, the first face being along a first direction and a second direction, the second direction crossing the first direction, the second face being along the second direction and a third direction, the third direction crossing a plane including the first direction and the second direction;
a second conductive member including a third conductive portion including a third face and a fourth conductive portion including a fourth face, the third face being along the first direction and the second direction, the fourth face being along the second direction and the third direction, a direction from the first conductive portion to the third conductive portion being along the third direction, a direction from the second conductive portion to the fourth conductive portion being along the first direction, the fourth conductive portion including a facing conductive portion;

a first semiconductor member of a first conductive type, the first semiconductor member being located between the first conductive portion and the third conductive portion in the third direction, the first semiconductor member being located between the second conductive portion and the fourth conductive portion in the first direction, the first semiconductor member including a first partial region, a second partial region and a third partial region, a direction from the first partial region to the second partial region being along the second direction, the third partial region being located between the first partial region and the facing conductive portion in the first direction, the third partial region including a facing face facing the facing conductive portion;

a third conductive member, a direction from the facing face to the third conductive member being along the second direction; and a third conductive member wiring electrically connected to the third conductive member, at least a part of the third conductive member wiring passing through one of a first position or a second position, the first position being between the first semiconductor member and the third conductive portion, the second position being between the first semiconductor member and the first conductive portion.

Configuration 2

The semiconductor device according to Configuration 1, wherein the third partial region and the facing conductive portion have Schottky contact.

Configuration 3

The semiconductor device according to Configuration 2, wherein the first element further includes a third conductive connect portion electrically connected to the third conductive member wiring, the third conductive connect portion extends along the third direction, and a direction from the first semiconductor member to the third conductive connect portion crosses the third direction.

Configuration 4

The semiconductor device according to Configuration 3, further comprising a resin member, at least a part of the third conductive connect part being not covered with the resin member.

Configuration 5

The semiconductor device according to Configuration 4, wherein the first element further includes a second conductive connect portion electrically connected to the third conductive portion, at least a part of the second conductive connect portion extends along the third direction, at least a part of the second conductive connect portion is not covered with the resin member, and the at least the part of the third conductive member wiring passes through the first position.

Configuration 6

The semiconductor device according to Configuration 5, wherein at least a part of the first conductive portion is not covered with the resin member.

Configuration 7

The semiconductor device according to Configuration 4, wherein the first element further includes a first conductive connect portion electrically connected to the first conductive portion, at least a part of the first conductive connect portion extends along the third direction, At least a part of the first conductive connect portion is not covered with the resin member, and the at least the part of the third conductive member wiring passes through the second position.

Configuration 8

The semiconductor device according to Configuration 7, wherein at least a part of the third conductive portion is not covered with the resin member.

Configuration 9

The semiconductor device according to any one of Configurations 1 to 8, wherein the first element further includes a first insulating member including a first insulating region, and at least a part of the first insulating region is located between the facing face and the third conductive member.

Configuration 10

The semiconductor device according to Configuration 9, wherein the first element further includes a second insulating member and a third insulating member, the second insulating member is located between the first conductive portion and the first semiconductor member, and the third insulating member is located between the first semiconductor member and the third conductive portion.

Configuration 11

The semiconductor device according to Configuration 9 or 10, wherein the first element further includes a fourth conductive member, the first semiconductor member further includes a fourth partial region, in the second direction, the second partial region is between the first partial region and the fourth partial region, a direction from the fourth partial region to the fourth conductive member is along the first direction,

a direction from at least a part of the third partial region to the fourth conductive member is along the second direction,
the first insulating member includes a second insulating region, and
the second insulating region is located between the at least the part of the third partial region and the fourth conductive member in the second direction.

Configuration 12

The semiconductor device according to Configuration 11, wherein
the fourth conductive member is electrically connected to the second conductive member, or
the fourth conductive member is configured to be electrically connected to the second conductive member.

Configuration 13

The semiconductor device according to Configuration 11 or 12, wherein
the first element includes
a plurality of the facing conductive portions, and
a plurality of the fourth conductive members,
a position of one of the plurality of facing conductive portions in the second direction is between a position of one of the plurality of fourth conductive members in the second direction and a position of another one of the plurality of fourth conductive members in the second direction, and
the other one of the plurality of fourth conductive members is next to the one of the plurality of fourth conductive members.

Configuration 14

The semiconductor device according to any one of Configurations 9 to 13, wherein
the first semiconductor member further includes a first portion and a second portion,
the third partial region includes a first position portion,
the first position portion is located between the first partial region and the facing face in the first direction,
the first portion is connected to the first position portion,
the second portion is connected to the first portion,
a position of the second portion in the first direction is between a position of the second partial region in the first direction and a position of the first portion in the first direction, and
a position of the first portion in the second direction is between a position of the third partial region in the second direction and a position of the second portion in the second direction.

Configuration 15

The semiconductor device according to any one of Configurations 9 to 13, wherein
the first element further includes a fifth conductive member,
the fifth conductive member further includes a first portion and a second portion,
the third partial region includes a first position portion,
the first position portion is located between the first partial region and the facing face in the first direction,
the first portion is connected to the first position portion,

the second portion is connected to the first portion,
a position of the second portion in the first direction is between a position of the second partial region in the first direction and a position of the first portion in the first direction, and
a position of the first portion in the second direction is between a position of the third partial region in the second direction and a position of the second portion in the second direction.

Configuration 16

The semiconductor device according to Configuration 14 or 15, wherein
the third partial region further includes a second position portion,
the second position portion is located between the first partial region and the first position portion,
a direction from the second position portion to the second portion is along the second direction, and
a part of the first insulating member is located between the second position portion and the second portion in the second direction.

Configuration 17

The semiconductor device according to any one of Configurations 1 to 16, further comprising
a second element,
the third conductive member wiring passing through the second position,
the second element including:
a first conductive member of the second element including a first conductive portion of the second element including a first face of the second element and a second conductive portion of the second element including a second face of the second element, the first face of the second element being along a first direction of the second element and a second direction of the second element, the second direction of the second element crossing the first direction of the second element, the second face of the second element being along the second direction of the second element and a third direction of the second element, the third direction of the second element crossing the plane;
a second conductive member of the second element including a third conductive portion of the second element including a third face of the second element and a fourth conductive portion of the second element including a fourth face of the second element, the third face of the second element being along the first direction of the second element and the second direction of the second element, the fourth face of the second element being along the second direction of the second element and the third direction of the second element, a direction from the first conductive portion of the second element to the third conductive portion of the second element being along the third direction of the second element, a direction from the second conductive portion of the second element to the fourth conductive portion of the second element being along the first direction of the second element, the fourth conductive portion of the second element including a facing conductive portion of the second element;

a first semiconductor member of the first conductive type of the second element, the first semiconductor member of the second element being located between the first conductive portion of the second element and the third conductive portion of the second element in the third direction of the second element, the first semiconductor member of the second element being located between the second conductive portion of the second element and the fourth conductive portion of the second element in the first direction of the second element, the first semiconductor member of the second element including a first partial region of the second element, a second partial region of the second element, and a third partial region of the second element, a direction from the first partial region of the second element to the second partial region of the second element being along the second direction of the second element, the third partial region of the second element being located between the first partial region of the second element and the facing conductive portion of the second element in the first direction of the second element, the third partial region of the second element including a facing face of the second element facing the facing conductive portion of the second element;

a third conductive member of the second element, a direction from the facing face of the second element to the third conductive member of the second element being along the second direction of the second element; and a third conductive member wiring of the second element electrically connected to the third conductive member of the second element, at least a part of the third conductive member wiring of the second element passing through a position between the first semiconductor member of the second element and the first conductive portion of the second element.

Configuration 18

The semiconductor device according to Configuration 17, wherein the fourth conductive portion of the first element is located between the second conductive portion of the first element and the fourth conductive portion of the second element in the first direction of the first element, and the second conductive portion of the second element is located between the fourth conductive portion of the first element and the fourth conductive portion of the second element in the first direction of the first element.

Configuration 19

The semiconductor device according to Configuration 18, wherein the first element includes a plurality of the second conductive portions of the first element, the fourth conductive portion of the first element is located between one of the plurality of second conductive portions of the first element and another one of the plurality of second conductive portions of the first element, the second element includes a plurality of the fourth conductive portions of the second element, and the second conductive portion of the second element is located between one of the plurality of fourth conductive portions of the second element and another one of the plurality of fourth conductive portions of the second element.

According to the embodiment, a semiconductor device capable of improving characteristics can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as conductive members, semiconductor members, insulating members, wirings, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

a first element, the first element including:

a first conductive member including a first conductive portion including a first face and a second conductive portion including a second face, the first face being along a first direction and a second direction, the second direction crossing the first direction, the second face being along the second direction and a third direction, the third direction crossing a plane including the first direction and the second direction;

a second conductive member including a third conductive portion including a third face and a fourth conductive portion including a fourth face, the third face being along the first direction and the second direction, the fourth face being along the second direction and the third direction, a direction from the first conductive portion to the third conductive portion being along the third direction, a direction from the second conductive portion to the fourth conductive portion being along the first direction, the fourth conductive portion including a facing conductive portion;

a first semiconductor member of a first conductive type, the first semiconductor member being located between the first conductive portion and the third conductive portion in the third direction, the first semiconductor member being located between the second conductive portion and the fourth conductive portion in the first direction, the first semiconductor member including a first partial region, a second partial region and a third partial region, a direction from the first partial region to the second partial region being along the second direction, the third partial region being located between the first partial region and the facing conductive portion in the first direction, the third partial region including a facing face facing the facing conductive portion;

a third conductive member, a direction from the facing face to the third conductive member being along the second direction; and a third conductive member wiring electrically connected to the third conductive member, at least a part of the third conductive member wiring passing through one of a first position or a second position, the first position being between the first semiconductor member and the third conductive portion, the second position being between the first semiconductor member and the first conductive portion.

2. The device according to claim 1, wherein the third partial region and the facing conductive portion have Schottky contact.

3. The device according to claim 2, wherein
the first element further includes a third conductive connect portion electrically connected to the third conductive member wiring,
the third conductive connect portion extends along the third direction, and
a direction from the first semiconductor member to the third conductive connect portion crosses the third direction.

4. The device according to claim 3, further comprising
a resin member,
at least a part of the third conductive connect part being not covered with the resin member.

5. The device according to claim 4, wherein
the first element further includes a second conductive connect portion electrically connected to the third conductive portion,
at least a part of the second conductive connect portion extends along the third direction,
at least a part of the second conductive connect portion is not covered with the resin member, and
the at least the part of the third conductive member wiring passes through the first position.

6. The device according to claim 5, wherein at least a part of the first conductive portion is not covered with the resin member.

7. The device according to claim 4, wherein the first element further includes a first conductive connect portion electrically connected to the first conductive portion,
at least a part of the first conductive connect portion extends along the third direction,
at least a part of the first conductive connect portion is not covered with the resin member, and
the at least the part of the third conductive member wiring passes through the second position.

8. The device according to claim 7, wherein at least a part of the third conductive portion is not covered with the resin member.

9. The device according to claim 1, wherein
the first element further includes a first insulating member including a first insulating region, and at least a part of the first insulating region is located between the facing face and the third conductive member.

10. The device according to claim 9, wherein
the first element further includes a second insulating member and a third insulating member,
the second insulating member is located between the first conductive portion and the first semiconductor member, and
the third insulating member is located between the first semiconductor member and the third conductive portion.

11. The device according to claim 9, wherein
the first element further includes a fourth conductive member,
the first semiconductor member further includes a fourth partial region,
in the second direction, the second partial region is between the first partial region and the fourth partial region,
a direction from the fourth partial region to the fourth conductive member is along the first direction,
a direction from at least a part of the third partial region to the fourth conductive member is along the second direction,
the first insulating member includes a second insulating region, and
the second insulating region is located between the at least the part of the third partial region and the fourth conductive member in the second direction.

12. The device according to claim 11, wherein
the fourth conductive member is electrically connected to the second conductive member, or
the fourth conductive member is configured to be electrically connected to the second conductive member.

13. The device according to claim 11, wherein
the first element includes
a plurality of the facing conductive portions, and
a plurality of the fourth conductive members,
a position of one of the plurality of facing conductive portions in the second direction is between a position of one of the plurality of fourth conductive members in the second direction and a position of another one of the plurality of fourth conductive members in the second direction, and
the other one of the plurality of fourth conductive members is next to the one of the plurality of fourth conductive members.

14. The device according to claim 9, wherein
the first semiconductor member further includes a first portion and a second portion,
the third partial region includes a first position portion,
the first position portion is located between the first partial region and the facing face in the first direction,
the first portion is connected to the first position portion,
the second portion is connected to the first portion,
a position of the second portion in the first direction is between a position of the second partial region in the first direction and a position of the first portion in the first direction, and
a position of the first portion in the second direction is between a position of the third partial region in the second direction and a position of the second portion in the second direction.

15. The device according to claim 9, wherein
the first element further includes a fifth conductive member, the fifth conductive member further includes a first portion and a second portion, the third partial region includes a first position portion, the first position portion is located between the first partial region and the facing face in the first direction, the first portion is connected to the first position portion, the second portion is connected to the first portion, a position of the second portion in the first direction is between a position of the second partial region in the first direction and a position of the first portion in the first direction, and a position of the first portion in the second direction is between a position of the third partial region in the second direction and a position of the second portion in the second direction.

16. The device according to claim 14, wherein the third partial region further includes a second position portion, the second position portion is located between the first partial region and the first position portion, a direction from the second position portion to the second portion is along the second direction, and a part of the first insulating member is located between the second position portion and the second portion in the second direction.

17. The device according to claim 1, further comprising a second element, the third conductive member wiring passing through the second position, the second element including:

a first conductive member of the second element including a first conductive portion of the second element including a first face of the second element and a second conductive portion of the second element including a second face of the second element, the first face of the second element being along a first direction of the second element and a second direction of the second element, the second direction of the second element crossing the first direction of the second element, the second face of the second element being along the second direction of the second element and a third direction of the second element, the third direction of the second element crossing the plane;

a second conductive member of the second element including a third conductive portion of the second element including a third face of the second element and a fourth conductive portion of the second element including a fourth face of the second element, the third face of the second element being along the first direction of the second element and the second direction of the second element, the fourth face of the second element being along the second direction of the second element and the third direction of the second element, a direction from the first conductive portion of the second element to the third conductive portion of the second element being along the third direction of the second element, a direction from the second conductive portion of the second element to the fourth conductive portion of the second element being along the first direction of the second element, the fourth conductive portion of the second element including a facing conductive portion of the second element;

a first semiconductor member of the first conductive type of the second element, the first semiconductor member of the second element being located between the first conductive portion of the second element and the third conductive portion of the second element in the third direction of the second element, the first semiconductor member of the second element being located between the second conductive portion of the second element and the fourth conductive portion of the second element in the first direction of the second element, the first semiconductor member of the second element including a first partial region of the second element, a second partial region of the second element, and a third partial region of the second element, a direction from the first partial region of the second element to the second partial region of the second element being along the second direction of the second element, the third partial region of the second element being located between the first partial region of the second element and the facing conductive portion of the second element in the first direction of the second element, the third partial region of the second element including a facing face of the second element facing the facing conductive portion of the second element;

a third conductive member of the second element, a direction from the facing face of the second element to the third conductive member of the second element being along the second direction of the second element; and a third conductive member wiring of the second element electrically connected to the third conductive member of the second element, at least a part of the third conductive member wiring of the second element passing through a position between the first semiconductor member of the second element and the first conductive portion of the second element.

18. The device according to claim 17, wherein the fourth conductive portion of the first element is located between the second conductive portion of the first element and the fourth conductive portion of the second element in the first direction of the first element, and the second conductive portion of the second element is located between the fourth conductive portion of the first element and the fourth conductive portion of the second element in the first direction of the first element.

19. The device according to claim 18, wherein the first element includes a plurality of the second conductive portions of the first element, the fourth conductive portion of the first element is located between one of the plurality of second conductive portions of the first element and another one of the plurality of second conductive portions of the first element, the second element includes a plurality of the fourth conductive portions of the second element, and the second conductive portion of the second element is located between one of the plurality of fourth conductive portions of the second element and another one of the plurality of fourth conductive portions of the second element.

* * * * *